United States Patent
Chen et al.

(10) Patent No.: US 10,886,263 B2
(45) Date of Patent: Jan. 5, 2021

(54) STACKED SEMICONDUCTOR PACKAGE ASSEMBLIES INCLUDING DOUBLE SIDED REDISTRIBUTION LAYERS

(71) Applicant: Advanced Semiconductor Engineering, Inc., Kaohsiung (TW)

(72) Inventors: William T. Chen, Kaohsiung (TW); John Richard Hunt, Kaohsiung (TW); Chih-Pin Hung, Kaohsiung (TW); Chen-Chao Wang, Kaohsiung (TW); Chih-Yi Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/721,257

(22) Filed: Sep. 29, 2017

(65) Prior Publication Data
US 2019/0103386 A1   Apr. 4, 2019

(51) Int. Cl.
*H01L 25/10* (2006.01)
*H01L 23/538* (2006.01)
(Continued)

(52) U.S. Cl.
CPC .......... *H01L 25/105* (2013.01); *H01L 21/486* (2013.01); *H01L 21/4853* (2013.01);
(Continued)

(58) Field of Classification Search
CPC . H01L 2225/06541; H01L 2225/06548; H01L 2225/06544; H01L 2225/06572;
(Continued)

(56) References Cited

U.S. PATENT DOCUMENTS 7,115,972 B2 * 10/2006 Dotta ................ H01L 21/76898
257/621
8,039,304 B2 * 10/2011 Pagaila ................. H01L 21/561
438/107
(Continued)

OTHER PUBLICATIONS

Kroehnert, S., et al., "WLFO Packaging Technology-based WLSiP—Enabler for Packaging of IoT/IoE Modules", Advancing Microelectronics, May/Jun. 2017, vol. 44 No. 3, 5 pages.
(Continued)

*Primary Examiner* — David A Zarneke
(74) *Attorney, Agent, or Firm* — Foley & Lardner LLP

(57) ABSTRACT

A semiconductor device package comprises a bottom electronic device, an interposer module, a top electronic device, and a double sided redistribution layer (RDL) structure. The interposer module includes a plurality of conductive vias. The top electronic device has an active surface and is disposed above the bottom electronic device and above the interposer module. The double sided RDL structure is disposed between the bottom electronic device and the top electronic device. The active surface of the bottom electronic device faces toward the double sided RDL structure. The active surface of the top electronic device faces toward the double sided RDL structure. The double sided RDL structure electrically connects the active surface of the bottom electronic device to the active surface of the top electronic device. The double sided RDL structure electrically connects the active surface of the top electronic device to the interposer module.

20 Claims, 34 Drawing Sheets

AAA

(51) Int. Cl.
*H01L 23/31* (2006.01)
*H01L 23/367* (2006.01)
*H01L 21/48* (2006.01)
*H01L 21/56* (2006.01)
*H01L 21/683* (2006.01)
*H01L 23/00* (2006.01)
*H01L 25/00* (2006.01)
*H01L 25/16* (2006.01)
*H01L 25/18* (2006.01)
*H01L 23/13* (2006.01)
*H01L 25/07* (2006.01)
*H01L 25/075* (2006.01)
*H01L 25/11* (2006.01)
*H01L 25/04* (2014.01)
*H01L 25/065* (2006.01)

(52) U.S. Cl.
CPC .......... *H01L 21/4857* (2013.01); *H01L 21/56* (2013.01); *H01L 21/565* (2013.01); *H01L 21/568* (2013.01); *H01L 21/6835* (2013.01); *H01L 23/3114* (2013.01); *H01L 23/3128* (2013.01); *H01L 23/367* (2013.01); *H01L 23/3677* (2013.01); *H01L 23/5383* (2013.01); *H01L 23/5384* (2013.01); *H01L 23/5386* (2013.01); *H01L 23/5389* (2013.01); *H01L 24/19* (2013.01); *H01L 24/20* (2013.01); *H01L 24/96* (2013.01); *H01L 25/16* (2013.01); *H01L 25/18* (2013.01); *H01L 25/50* (2013.01); *H01L 23/13* (2013.01); *H01L 25/043* (2013.01); *H01L 25/0657* (2013.01); *H01L 25/074* (2013.01); *H01L 25/0756* (2013.01); *H01L 25/117* (2013.01); *H01L 2221/68345* (2013.01); *H01L 2221/68372* (2013.01); *H01L 2221/68381* (2013.01); *H01L 2224/214* (2013.01); *H01L 2224/95001* (2013.01); *H01L 2225/1035* (2013.01); *H01L 2225/1041* (2013.01); *H01L 2225/1058* (2013.01); *H01L 2225/1094* (2013.01)

(58) Field of Classification Search
CPC ..... H01L 2225/1035; H01L 2225/1041; H01L 2225/1047; H01L 2225/107; H01L 25/043; H01L 25/0657; H01L 25/074; H01L 25/0756; H01L 25/117
See application file for complete search history.

(56) References Cited

U.S. PATENT DOCUMENTS

| 8,138,609 | B2* | 3/2012 | Horiuchi | H05K 1/185 257/773 |
| 8,227,904 | B2 | 7/2012 | Braunisch et al. | |
| 8,264,080 | B2* | 9/2012 | Pagaila | H01L 21/561 257/737 |
| 8,535,980 | B2* | 9/2013 | Chua | H01L 23/5389 438/108 |
| 8,619,431 | B2* | 12/2013 | Lin | H01L 23/49816 361/761 |
| 8,710,668 | B2* | 4/2014 | Lee | H01L 23/3135 257/774 |
| 8,810,008 | B2* | 8/2014 | Mori | H01L 23/5389 257/621 |
| 8,866,301 | B2* | 10/2014 | Lin | H01L 21/4846 257/686 |
| 8,916,481 | B2* | 12/2014 | Gan | H01L 24/20 438/760 |
| 8,928,114 | B2* | 1/2015 | Chen | H01L 23/49827 257/532 |
| 8,980,691 | B2* | 3/2015 | Lin | H01L 23/5389 438/107 |
| 8,987,896 | B2* | 3/2015 | Cheah | H01L 25/0655 257/724 |
| 9,142,502 | B2* | 9/2015 | Gong | H01L 23/5389 |
| 9,258,922 | B2* | 2/2016 | Chen | H01L 23/49827 |
| 9,391,041 | B2* | 7/2016 | Lin | H01L 23/49827 |
| 9,780,074 | B2* | 10/2017 | Kim | H01L 25/0657 |
| 9,831,170 | B2* | 11/2017 | Scanlan | H01L 23/49838 |
| 10,475,770 | B2* | 11/2019 | Lee | H01L 23/5386 |
| 10,707,050 | B2* | 7/2020 | Kowal | H01J 37/24 |
| 2011/0155433 | A1* | 6/2011 | Funaya | H01L 23/49827 174/258 |
| 2013/0182402 | A1* | 7/2013 | Chen | H01L 23/49827 361/807 |
| 2014/0103488 | A1* | 4/2014 | Chen | H01L 24/83 257/532 |
| 2016/0233196 | A1 | 8/2016 | Kim et al. | |
| 2017/0077022 | A1 | 3/2017 | Scanlan et al. | |
| 2018/0026022 | A1* | 1/2018 | Lee | H01L 21/561 257/659 |
| 2018/0122772 | A1* | 5/2018 | Kim | H01L 23/5383 |

OTHER PUBLICATIONS

Sharma, G., et al., "Development of a FOWLP platform for high-performance and RF SiP applications", Chip Scale Review May/Jun. 2017, 7 pages.

* cited by examiner

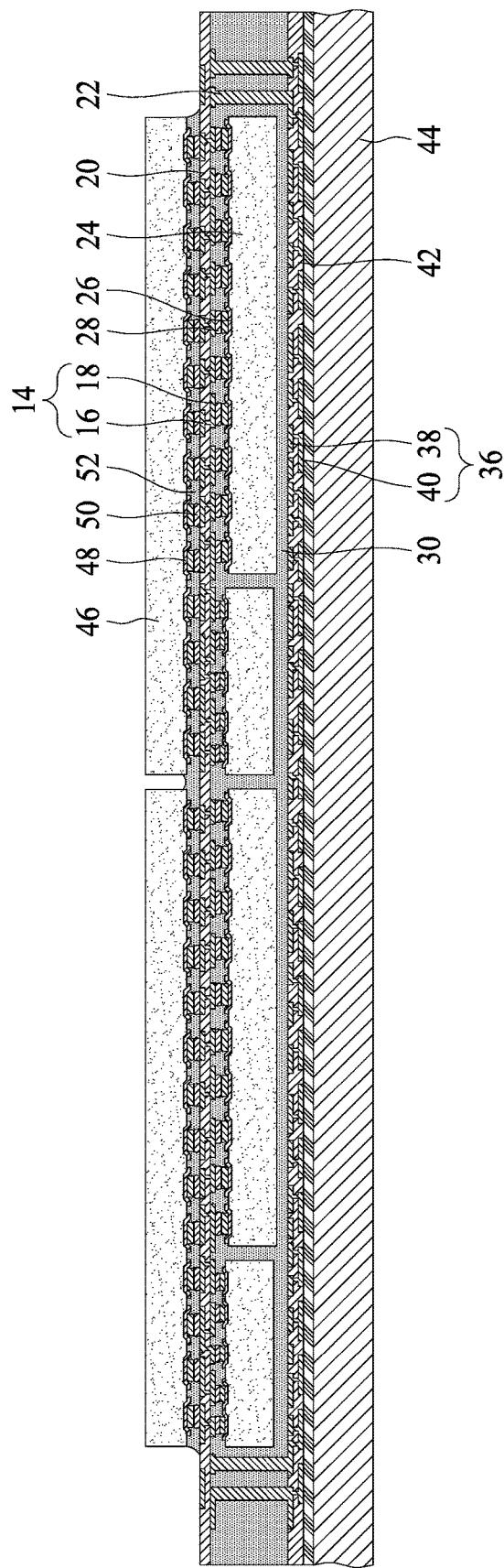
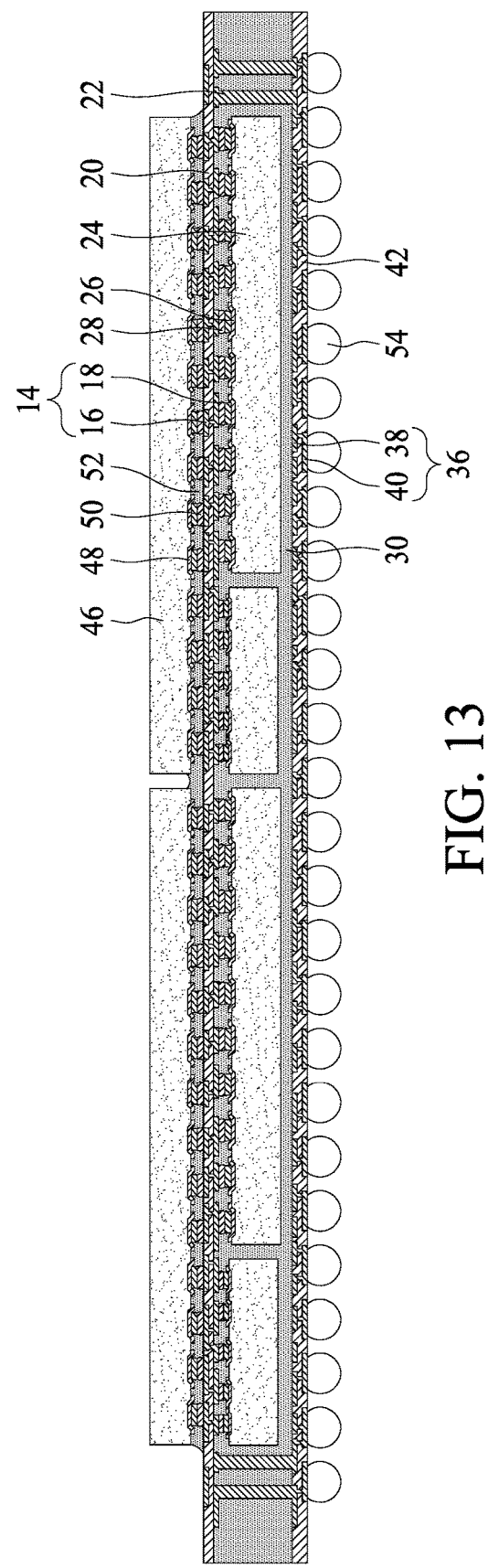
FIG. 12
FIG. 13

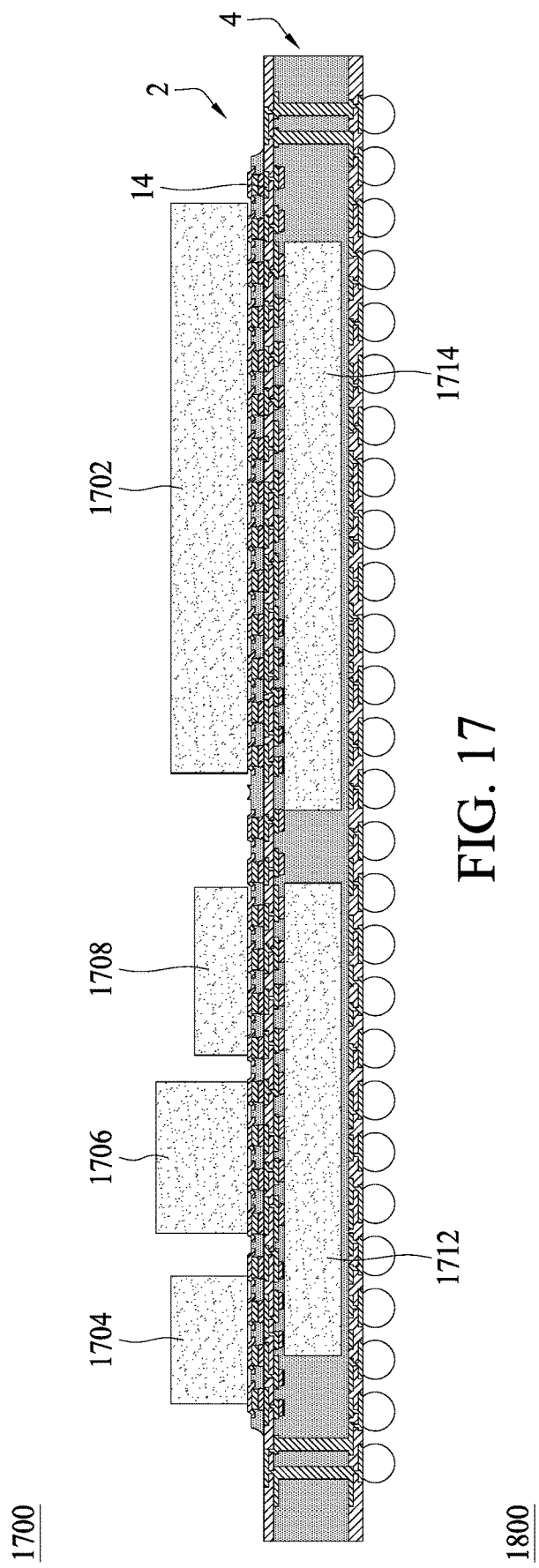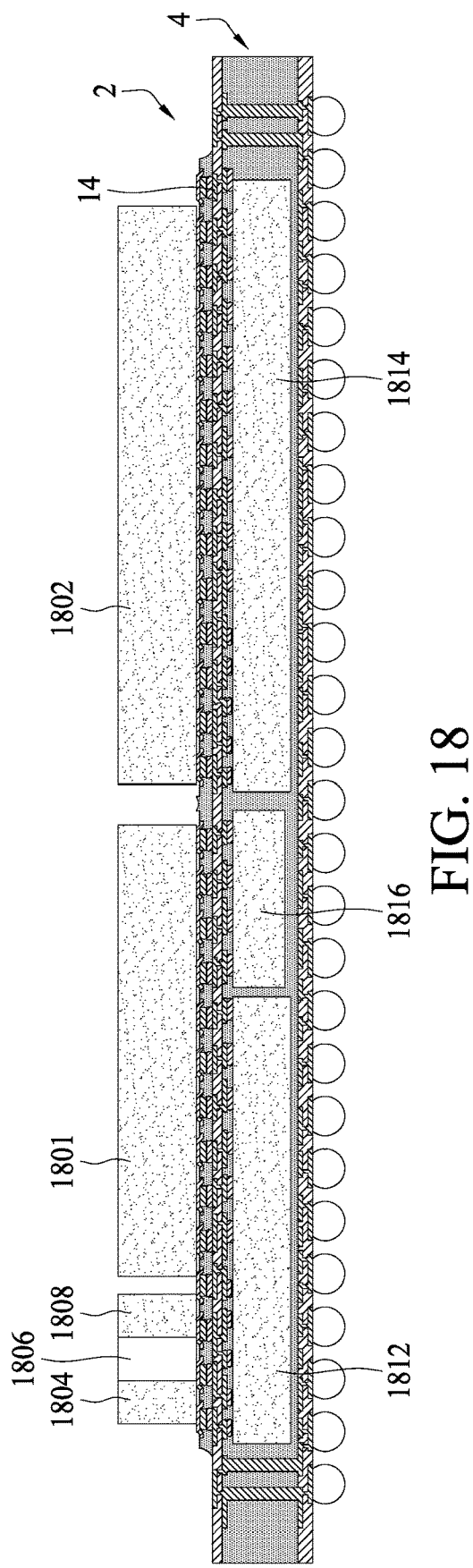

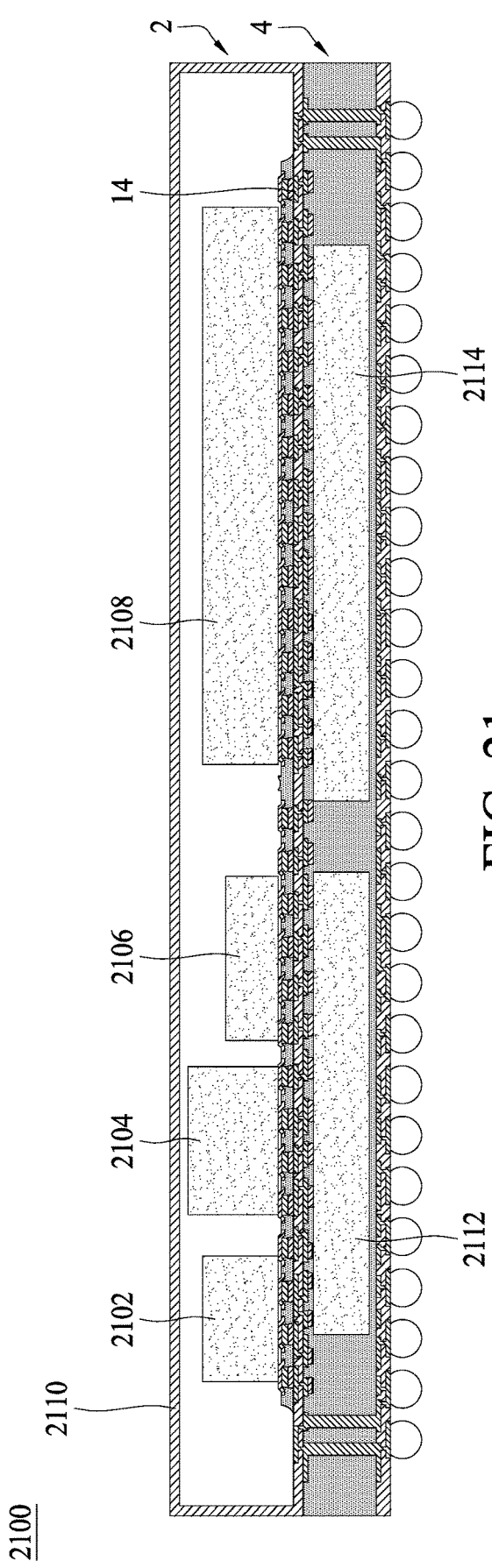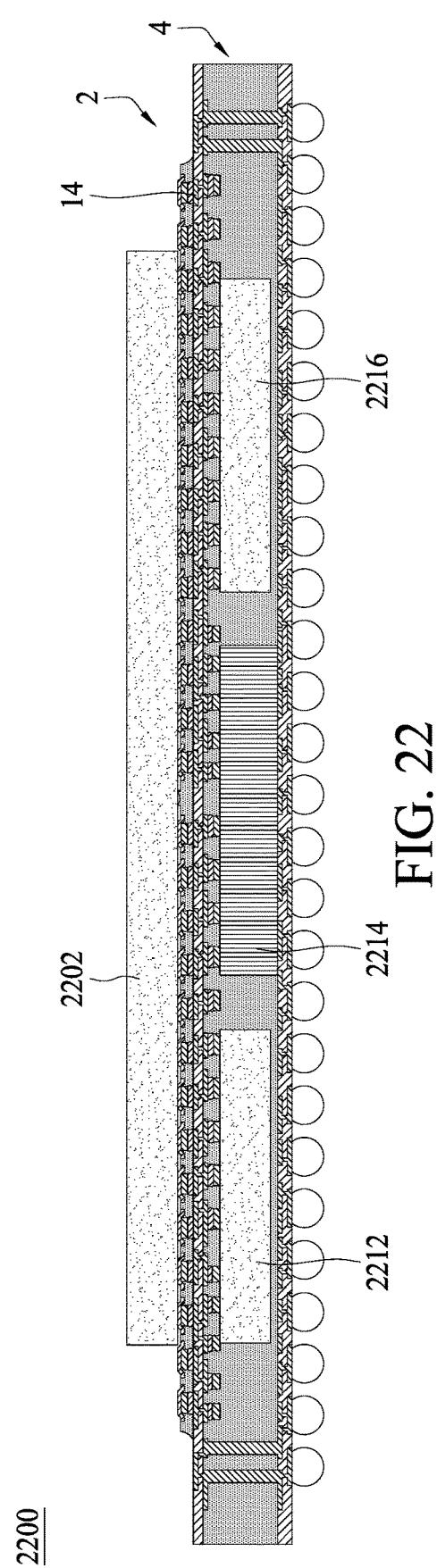

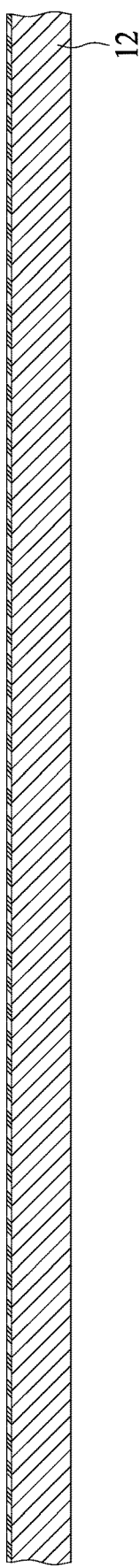
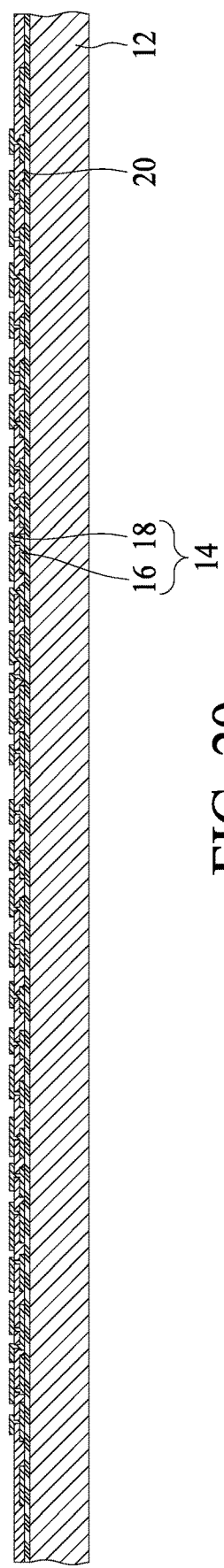

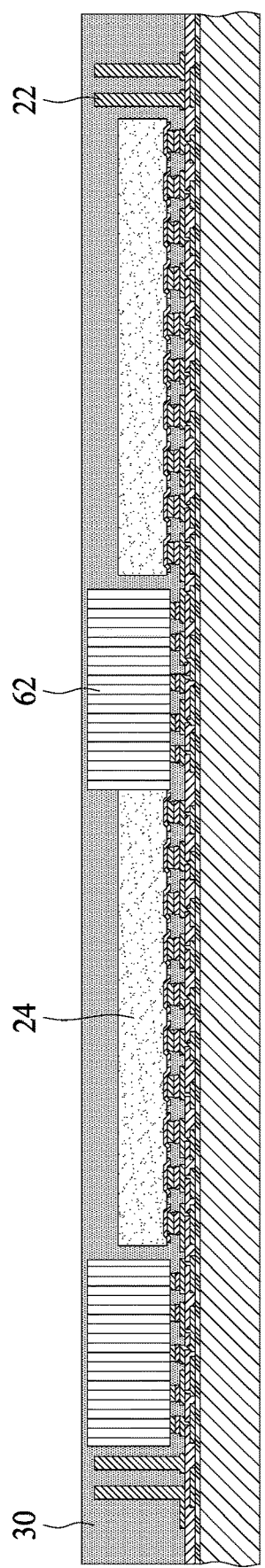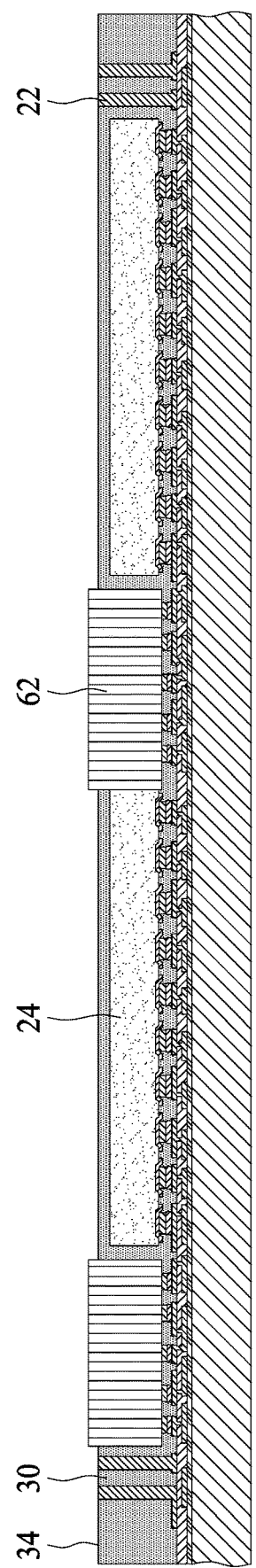

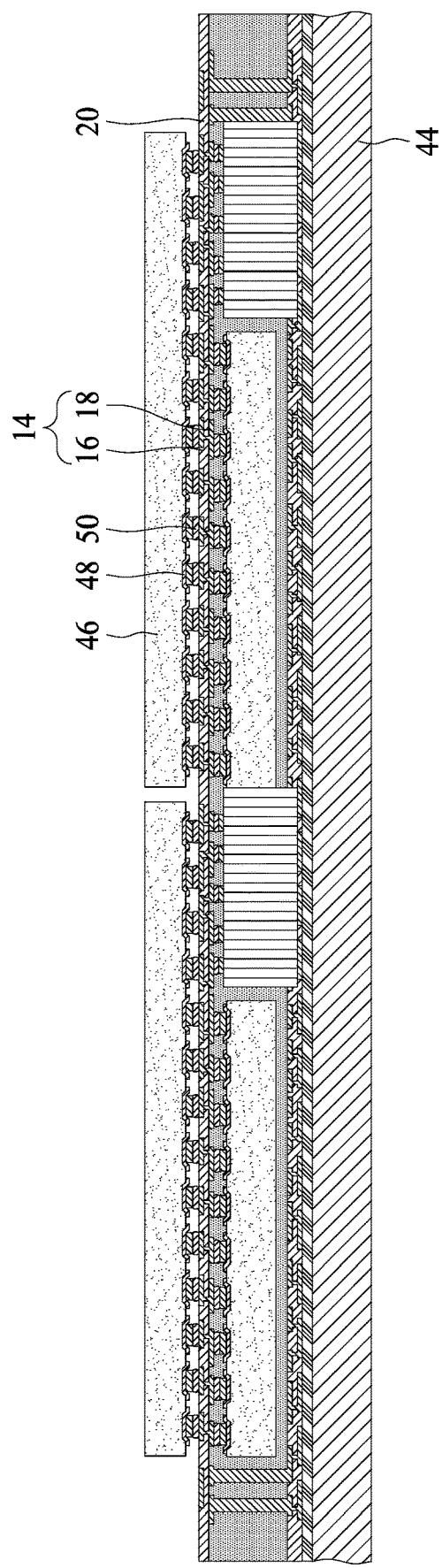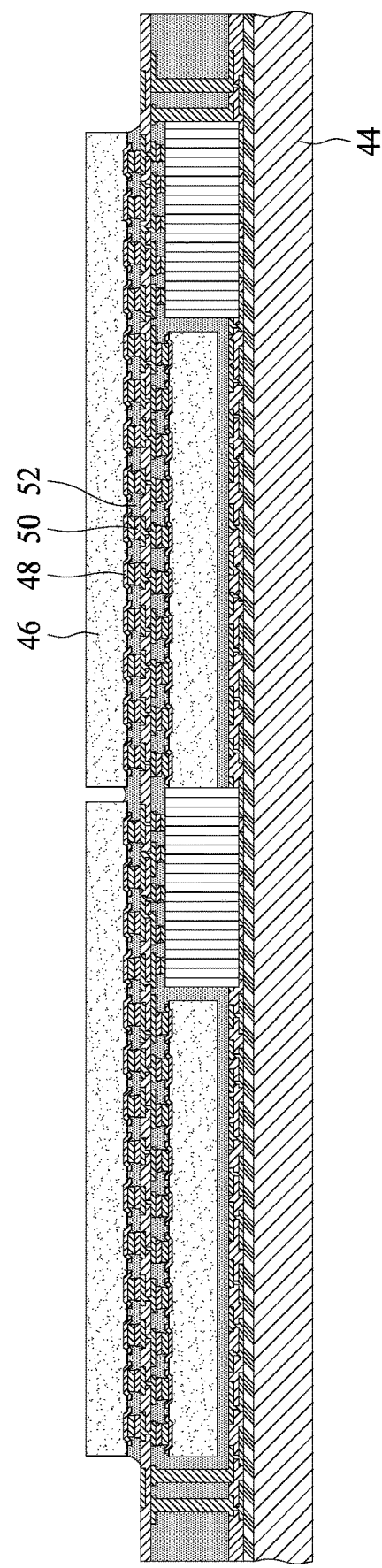
FIG. 46
FIG. 47

STACKED SEMICONDUCTOR PACKAGE ASSEMBLIES INCLUDING DOUBLE SIDED REDISTRIBUTION LAYERS

BACKGROUND

1. Field of the Disclosure

The present disclosure relates to stacked semiconductor package assemblies. More particularly, the present disclosure relates to stacked semiconductor package assemblies including double sided redistribution layers.

2. Description of the Related Art

To address a trend towards smaller sizes and increased functionality, semiconductor devices have become progressively more complex. For instance, to support increased functionality, semiconductor devices may include stacked semiconductor package assemblies such as a package-on-package (POP) structure. The POP structure includes a top package stacked on a bottom package. To form electrical connections between the top package and the bottom package, a top surface of the bottom package may have exposed pads, to which respective pads at a bottom surface of the top package connect. Improvements in the electrical connections of the POP structure are desirable.

Furthermore, the semiconductors packages may include devices having large numbers of contact pads for electrical connections, such as for inputs and outputs of the devices. For example, in a fan-out configuration, electrical connections can be routed from contact pads of a semiconductor device to outside of an area defined by a periphery of the semiconductor device. However, forming and routing the electrical connections from the increasing number of contact pads may result in greater process complexity and cost, and may occupy a large amount of surface area of a semiconductor package. In particular, forming and routing electrical connections between semiconductor devices in a POP structure in the fan-out configuration can be challenging.

SUMMARY

In one aspect according to some embodiments, a semiconductor device package comprises a bottom electronic device, an interposer module, a top electronic device, and a double sided redistribution layer (RDL) structure. The interposer module includes a plurality of conductive vias. The top electronic device has an active surface and is disposed above the bottom electronic device and above the interposer module. The double sided RDL structure is disposed between the bottom electronic device and the top electronic device. The active surface of the bottom electronic device faces toward the double sided RDL structure. The active surface of the top electronic device faces toward the double sided RDL structure. The double sided RDL structure electrically connects the active surface of the bottom electronic device to the active surface of the top electronic device. The double sided RDL structure electrically connects the active surface of the top electronic device to the interposer module.

In another aspect according to some embodiments, a semiconductor device package comprises a bottom electronic device, a package body, a top electronic device, a double sided RDL structure, a second RDL structure, and an interposer module, such as a through-silicon via (TSV) module. The bottom electronic device has an active surface facing upward and a back surface opposite to the active surface. The package body encapsulates the bottom electronic device and covers the back surface of the bottom electronic device. The top electronic device has an active surface facing downward and is disposed above the bottom electronic device. The double sided RDL structure is disposed between the bottom electronic device and the top electronic device. The double sided RDL structure electrically connects the active surface of the bottom electronic device to the active surface of the top electronic device. The second RDL structure is disposed below the bottom electronic device. The interposer module electrically connects the double sided RDL structure to the second RDL structure.

In another aspect according to some embodiments, a method for manufacturing a semiconductor device package comprises: forming a first RDL structure, the first RDL structure having a first side and a second side; disposing an interconnect, a first bottom electronic device, and a second bottom electronic device on the first side of the first RDL structure; and disposing a top electronic device on the second side of the first RDL structure, the first RDL structure electrically connecting the top electronic device to at least one of the first bottom electronic device or the second bottom electronic device.

In yet another aspect according to some embodiments, a semiconductor device package comprises a first redistribution layer (RDL) structure, a first bottom electronic device, a first connector, a second bottom electronic device, a second connect, a package body, an interconnect, and a top electronic device. The first RDL structure has a top side and a bottom side. The first bottom electronic device has an active surface facing toward the bottom side of the first RDL structure and a back surface opposite to the active surface of the first bottom electronic device. The first connector extends between the active surface of the first bottom electronic device and the bottom side of the first RDL structure. The first connector includes solder. The second bottom electronic device has an active surface facing toward the bottom side of the first RDL structure and a back surface opposite to the active surface of the second bottom electronic device. The second connector extends between the active surface of the second bottom electronic device and the bottom side of the first RDL structure. The second connector includes solder. The package body encapsulates the first bottom electronic device and the second bottom electronic device. The interconnect extends through the package body and is electrically connected to the first RDL structure. The top electronic device has an active surface facing toward the top side of the first RDL structure and is electrically connected to the first RDL structure.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings. In the drawings, like reference numbers denote similar components, unless the context clearly dictates otherwise.

FIG. 12 illustrates one or more stages of a method of manufacturing a stacked semiconductor package assembly according to some embodiments of the present disclosure.

FIG. 13 illustrates one or more stages of a method of manufacturing a stacked semiconductor package assembly according to some embodiments of the present disclosure.

FIG. 17 illustrates a cross-sectional view of a stacked semiconductor package assembly implemented as a wireless communication front end module (FEM), according to some embodiments of the present disclosure FIG. 18 illustrates a cross-sectional view of a stacked semiconductor package assembly implemented as a wireless communication FEM, according to some embodiments of the present disclosure.

FIG. 21 illustrates a cross-sectional view of a stacked semiconductor package assembly implemented as a SiP, according to some embodiments of the present disclosure.

FIG. 22 illustrates a cross-sectional view of a stacked semiconductor package assembly implemented as a networking router or switch, according to some embodiments of the present disclosure.

FIG. 28 illustrates one or more stages of a method of manufacturing a stacked semiconductor package assembly according to some embodiments of the present disclosure.

FIG. 29 illustrates one or more stages of a method of manufacturing a stacked semiconductor package assembly according to some embodiments of the present disclosure.

FIG. 42 illustrates one or more stages of a method of manufacturing a stacked semiconductor package assembly according to some embodiments of the present disclosure.

FIG. 43 illustrates one or more stages of a method of manufacturing a stacked semiconductor package assembly according to some embodiments of the present disclosure.

FIG. 46 illustrates one or more stages of a method of manufacturing a stacked semiconductor package assembly according to some embodiments of the present disclosure.

FIG. 47 illustrates one or more stages of a method of manufacturing a stacked semiconductor package assembly according to some embodiments of the present disclosure.

DETAILED DESCRIPTION

Figure 1:
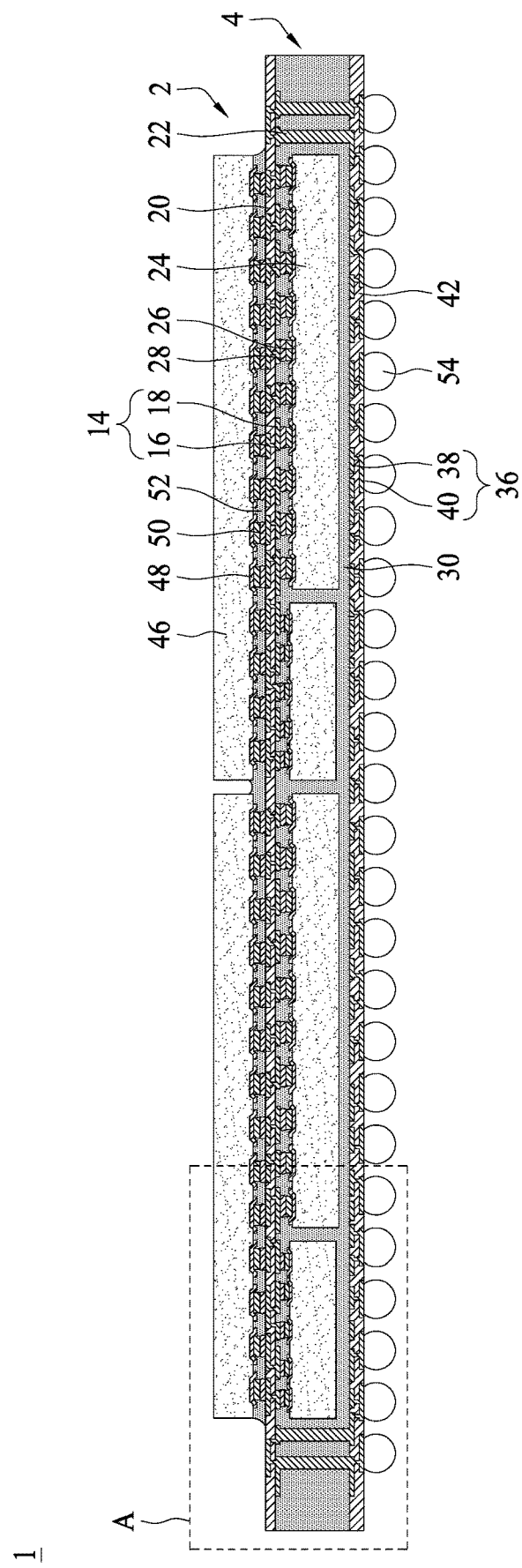
FIG. 1 illustrates a cross-sectional view of a stacked semiconductor package assembly according to some embodiments of the present disclosure.
Figure 1A:
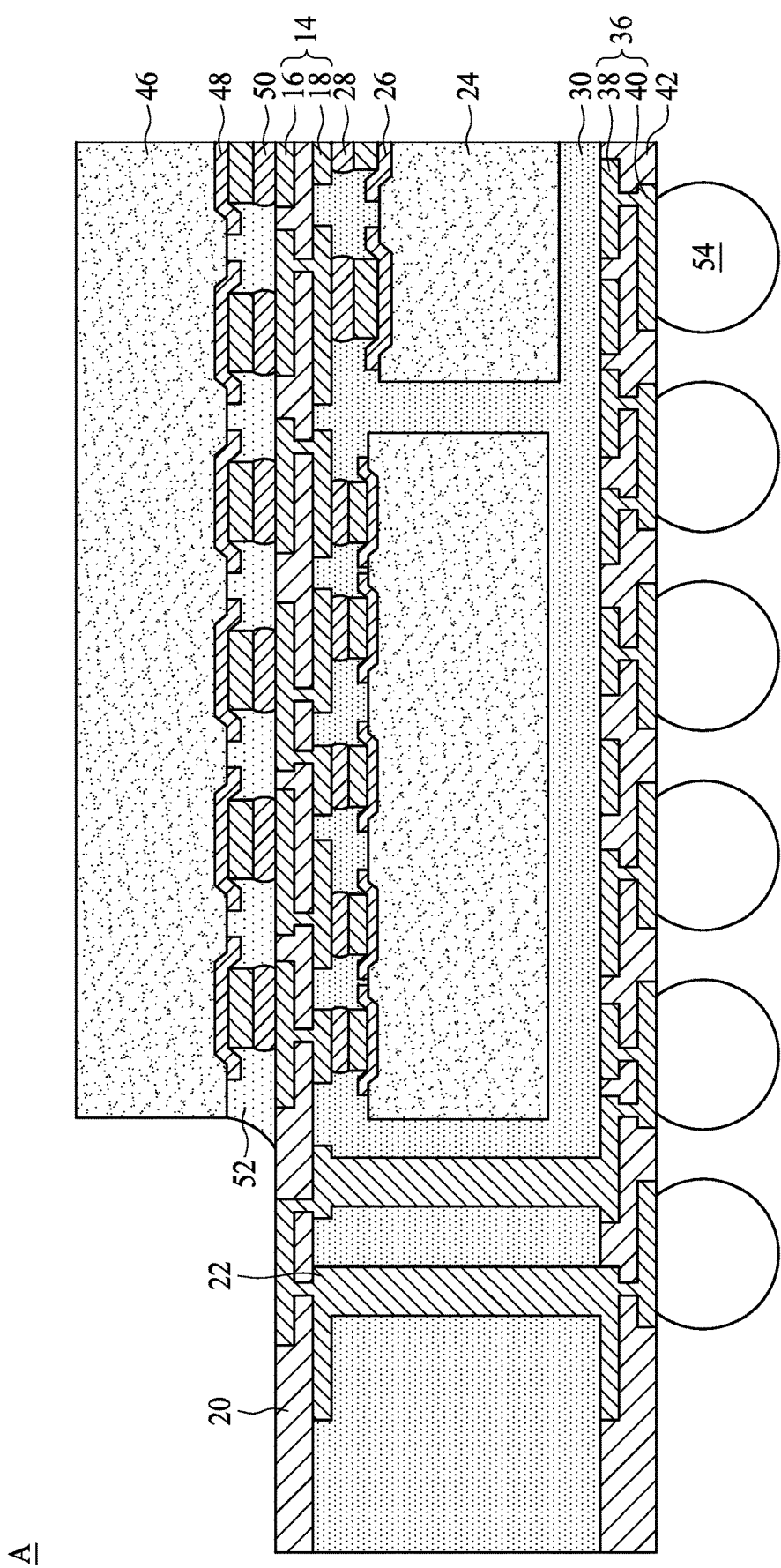
FIG. 1A illustrates an enlarged view of an area A of FIG. 1.

FIG. 1 illustrates a cross-sectional view of a stacked semiconductor package assembly 1 according to some embodiments of the present disclosure. FIG. 1A illustrates an enlarged view of an area A of FIG. 1. The stacked semiconductor package assembly 1 includes a top package 2 and a bottom package 4. The top package 2 is stacked on the bottom package 4. The top package 2 includes one or more electronic devices 46 (also referred to as top electronic devices). The bottom package 4 includes one or more electronic devices 24 (also referred to as bottom electronic devices). In some embodiments, each of the electronic devices 46 and 24 may be an active device corresponding to a semiconductor die or chip, although it is contemplated that the electronic devices 46 and/or 24, in general, can be any active devices (semiconductor dies or chips, transistors, etc.), any passive devices (e.g., resistors, capacitors, inductors, transformers, etc.), or a combination of two or more thereof.

Each of the top electronic devices 46 has a bottom surface (also referred to as active surface) and includes contact pads 48 on the active surface facing downward for electrical connections. Each of the bottom electronic devices 24 has a top surface (also referred to as active surface) and includes contact pads 26 on the active surface facing upwards for electrical connections.

A redistribution layer (RDL) structure 14 is disposed between the contacts pads 48 of the top electronic devices 46 and the contact pads 26 of the bottom electronic devices 24 to establish electrical connections thereof. The RDL structure 14 is also referred to as double sided RDL structure, as both sides of the RDL structure 14 are electrically connected to the electronic devices 46 and 24. In some embodiments, the RDL structure 14 may include one or more RDLs. For example, as illustrated in FIGS. 1 and 1A, the RDL structure 14 may include a first RDL 16 and a second RDL 18. In some embodiments, at least some traces of the first RDL 16 are electrically connected to some traces of the second RDL 18. In some embodiments, the RDL structure 14 includes, e.g., gold (Au), silver (Ag), nickel (Ni), copper (Cu), other metal(s) or alloy(s), or a combination of two or more thereof.

One or more dielectric layers 20 are disposed to encapsulate at least a portion of the RDL structure 14. For example, as illustrated in FIGS. 1 and 1A, the dielectric layer 20 encapsulates the RDL 16 and exposes the RDL 18. In some embodiments, the dielectric layer 20 may include organic material, solder mask, polyimide (PI), epoxy, Ajinomoto build-up film (ABF), molding compound, or a combination of two or more thereof.

The stacked semiconductor package assembly 1 may further include another RDL structure 36 disposed below the bottom electronic devices 24. In some embodiments, the RDL structure 36 may include one or more RDLs. For example, as illustrated in FIGS. 1 and 1A, the RDL structure 36 may include a first RDL 38 and a second RDL 40. In some embodiments, at least some traces of the first RDL 38 are electrically connected to some traces of the second RDL 40. In some embodiments, the RDL structure 36 includes, e.g., Au, Ag, Ni, Cu, other metal(s) or alloy(s), or a combination of two or more thereof. A dielectric layer 42 is disposed to encapsulate at least a portion of the RDL structure 36. In some embodiments, the dielectric layer 42 may include organic material, solder mask, PI, epoxy, ABF, molding compound, or a combination of two or more thereof.

The stacked semiconductor package assembly 1 may further include one or more interconnects extending between the RDL structure 14 and another RDL structure 36. As illustrated, the interconnects are conductive posts 22 which may electrically connect the RDL structure 14 (e.g., the second RDL 18 of the RDL structure 14) to the RDL structure 36 (e.g., the first RDL 38 of the RDL structure 36). In some embodiments, the conductive posts 22 may be disposed over a periphery of the stacked semiconductor package assembly 1. In some embodiments, the conductive posts 22 include, e.g., Au, Ag, Ni, Cu, other metal(s) or alloy(s), or a combination of two or more thereof. A lateral periphery of each conductive post 22 can be generally circular in shape and can have a diameter of about 20 µm to about 100 µm, about 30 µm to about 100 µm, 40 µm to about 100 µm, or 50 µm to about 100 µm.

The bottom electronic devices 24 may be electrically connected to the RDL structure 14 by, e.g., flip-chip mounting. As illustrated in FIGS. 1 and 1A, each of the electronic devices 24 includes contact pads 26 for electrical connections. In some embodiments, the contact pads 26 may be Controlled Collapse Chip Connection (C4) bumps, a Ball Grid Array (BGA) or a Land Grid Array (LGA). Connectors 28 are disposed between the contact pads 26 of the electronic devices 24 and the RDL structure 14, and electrically connect the contact pads 26 of the electronic devices 24 to the RDL structure 14 (e.g., the second RDL 18 of the RDL structure 14). The connectors 28 can be, for example, conductive bumps formed from, or including, solder or another conductive material, and/or conductive posts formed from, or including, copper, a copper alloy, or another metal, another metal alloy, or another combination of metals or other conductive materials.

Similarly, the top electronic devices 46 may be electrically connected to the RDL structure 14 by, e.g., flip-chip mounting. As illustrated in FIGS. 1 and 1A, each of the electronic devices 46 includes contact pads 48 for electrical connections. In some embodiments, the contact pads 48 may be C4 bumps, a BGA or a LGA. Connectors 50 are disposed between the contact pads 48 of the electronic devices 46 and the RDL structure 14, and electrically connect the contact pads 48 of the electronic devices 46 to the RDL structure 14 (e.g., the first RDL 16 of the RDL structure 14). The connectors 50 can be, for example, conductive bumps formed from, or including, solder or another conductive material, and/or conductive posts formed from, or including, copper, a copper alloy, or another metal, another metal alloy, or another combination of metals or other conductive materials.

The stacked semiconductor package assembly 1 may further include a package body 30 disposed to encapsulate the electronic devices 24. As illustrated, the package body 30 includes a portion disposed between the electronic devices 24 and the RDL structure 36, such that the package body 30 covers a bottom surface (also referred to as back surface) of each of the electronic devices 24. The package body 30 further encapsulates a portion of the RDL structure 14 (e.g., the second RDL 18), and a portion of the conductive posts 22. As illustrated in FIGS. 1 and 1A, side surfaces the conductive posts 22 are covered by the package body 30. Both terminal ends of each conductive post 22 are exposed from the package body 30 and electrically connect the RDL structures 14 and 36 respectively. In some embodiments, the package body 30 may include, for example, one or more organic materials (e.g., molding compound, BT, PI, PBO, solder resist, ABF, PP, epoxy-based material, or a combination of two or more thereof), inorganic materials (e.g., silicon, glass, ceramic, quartz, or a combination of two or more thereof), liquid, dry-film material(s), or a combination of two or more thereof. Another package body may be included to encapsulate the top electronic devices 46.

The stacked semiconductor package assembly 1 may further include an underfill 52 disposed to cover the active surfaces of the electronic devices 46 and connectors 50. In some embodiments, the underfill 52 includes an epoxy resin, a molding compound (e.g., an epoxy molding compound or other molding compound), a polyimide, a phenolic compound or material, a material including a silicone dispersed therein, or a combination of two or more thereof. In some embodiments, the underfill 52 may be a capillary underfill (CUF), a molded underfill (MUF) or a dispensing gel, depending on specifications of different embodiments.

The stacked semiconductor package assembly 1 may further include connecting elements 54 (e.g., bumps or solder balls) that electrically connect the RDL structure 36 (e.g., the second RDL 40 of the RDL structure 36). In some embodiments, the connecting elements 54 are C4 bumps, a BGA or an LGA.

According to at least some embodiments of the present disclosure, the double sided RDL structure 14 electrically connect the top electronic devices 46 to the bottom electronic devices 24. Thus, the double sided RDL structure 14 can be used for data communications between the top electronic devices 46 and the bottom electronic devices 24, thereby providing short and efficient communication paths between the top electronic devices 46 and the bottom electronic devices 24. In addition, the double sided RDL structure 14 can be used for data communications among the top electronic devices 46 through die-to-die connections. Similarly, the double sided RDL structure 14 can be used for data communications among the bottom electronic devices 24 through die-to-die connections. Furthermore, the top electronic devices 46 and the bottom electronic devices 24 can communicate with external devices and receive electrical power through the double sided RDL structure 14, the conductive posts 22, the RDL structure 36 and the connecting elements 54.

Figure 2:
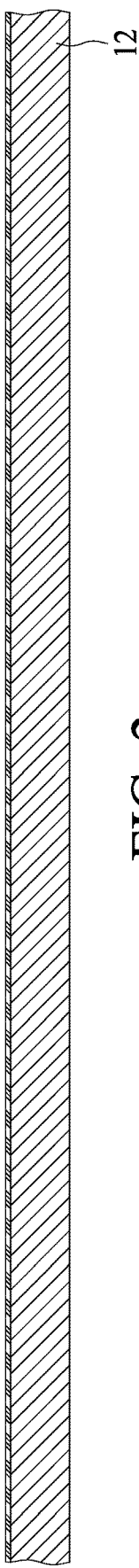
FIG. 2 illustrates one or more stages of a method of manufacturing a stacked semiconductor package assembly according to some embodiments of the present disclosure.

FIGS. 2-13 illustrate various stages of a method of manufacturing a stacked semiconductor package assembly according to some embodiments of the present disclosure. The manufacturing method can be referred to as a "chip last" method. Referring to FIG. 2, a temporary carrier 12 is provided. The carrier 12 can be any of a variety of suitable carriers, such as wafers or panels.

Figure 3:
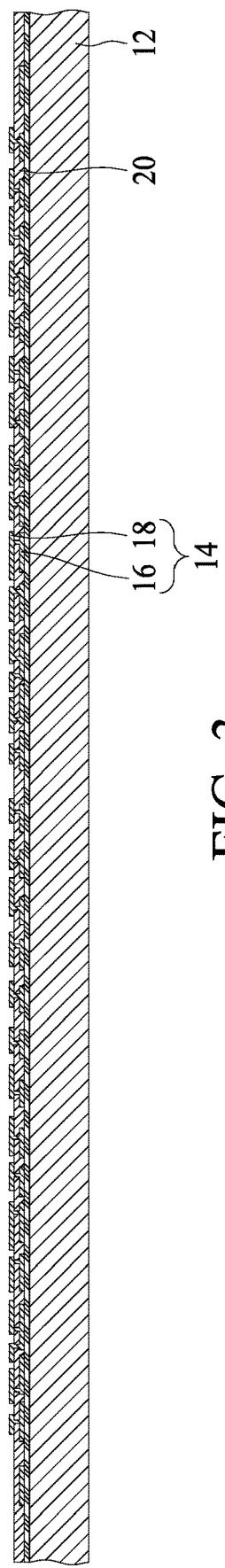
FIG. 3 illustrates one or more stages of a method of manufacturing a stacked semiconductor package assembly according to some embodiments of the present disclosure.

Referring to FIG. 3, a RDL structure 14 is disposed or formed over the temporary carrier 12. In some embodiments, the RDL structure 14 may include one or more RDLs. For example, as illustrated in FIG. 3, the RDL structure 14 may include a first RDL 16 and a second RDL 18 disposed over the first RDL 16. In some embodiments, at least some traces of the first RDL 16 are electrically connected to some traces of the second RDL 18. In some embodiments, the RDL structure 14 includes, e.g., gold (Au), silver (Ag), Nickel (Ni), copper (Cu), other metal(s) or alloy(s), or a combination of two or more thereof.

A dielectric layer 20 is disposed or formed to encapsulate at least a portion of the RDL structure 14. For example, as illustrated in FIG. 3, the dielectric layer 20 is formed to encapsulate the RDL 16, and the RDL 18 is formed on the dielectric layer 20 and is exposed from the dielectric layer 20. In some embodiments, the dielectric layer 20 may include organic material, solder mask, PI, epoxy, ABF, molding compound, or a combination of two or more thereof. According to the "chip last" method, the RDL structure 14 can be tested to verify it is free of defects, prior to mounting electronic devices to the RDL structure 14.

Figure 4:
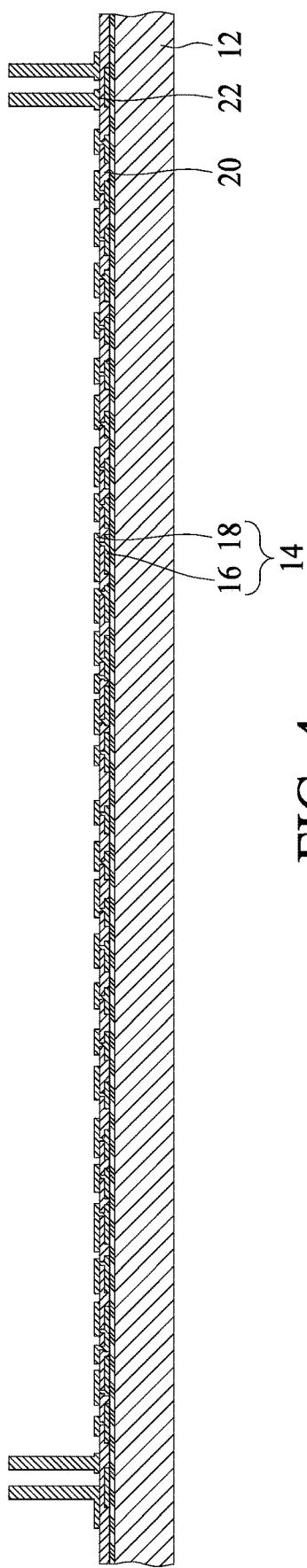
FIG. 4 illustrates one or more stages of a method of manufacturing a stacked semiconductor package assembly according to some embodiments of the present disclosure.

Referring to FIG. 4, one or more conductive posts 22 are disposed or formed over the RDL structure 14. In some embodiments, the conductive posts 22 are disposed over a periphery of the RDL structure 14. The conductive posts 22 may be electrically connected to the RDL structure 14 (e.g., the second RDL 18 of the RDL structure 14). In some embodiments, the conductive posts 22 include, e.g., Au, Ag, Ni, Cu, other metal(s) or alloy(s), or a combination of two or more thereof. The conductive posts 22 can be pre-formed and electrically connected to the RDL structure 14 through solder or other conductive material, or can be formed on the RDL structure 14 through, e.g., plating.

Figure 5:
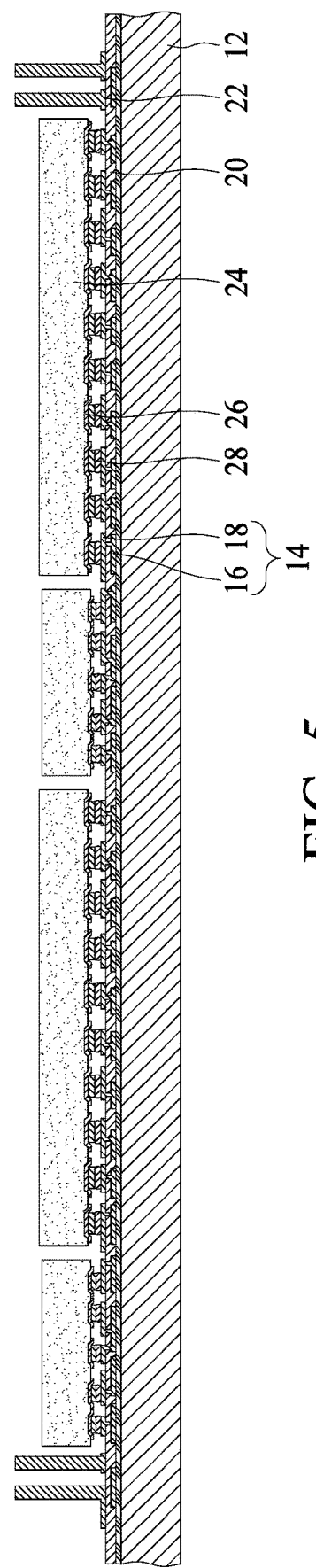
FIG. 5 illustrates one or more stages of a method of manufacturing a stacked semiconductor package assembly according to some embodiments of the present disclosure.

Referring to FIG. 5, one or more electronic devices 24 are disposed over the RDL structure 14 and the dielectric layer 20, and are electrically connected to the RDL structure 14 by, e.g., flip-chip mounting. As illustrated in FIG. 5, each of the electronic devices 24 includes contact pads 26 for electrical connections. In some embodiments, the contact pads 26 may be C4 bumps, a BGA or an LGA.

Connectors 28 are disposed between the contact pads 26 of the electronic devices 24 and the RDL structure 14, and electrically connect the contact pads 26 of the electronic devices 24 to the RDL structure 14 (e.g., the second RDL 18 of the RDL structure 14). The connectors 28 can be, for example, conductive bumps formed from, or including, solder or another conductive material, and/or conductive posts formed from, or including, copper, a copper alloy, or another metal, another metal alloy, or another combination of metals or other conductive materials. As illustrated in FIG. 5, each of the electronic devices 24 may be an active device corresponding to a semiconductor die or chip, although it is contemplated that the electronic devices 24, in general, can be any active devices (semiconductor dies or chips, transistors, etc.), any passive devices (e.g., resistors, capacitors, inductors, transformers, etc.), or a combination of two or more thereof.

Figure 6:
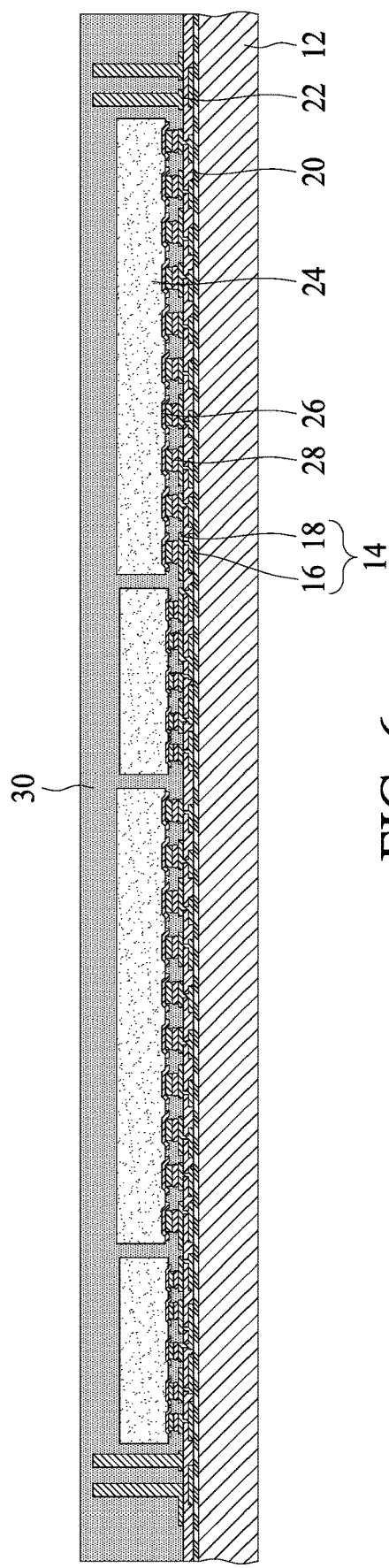
FIG. 6 illustrates one or more stages of a method of manufacturing a stacked semiconductor package assembly according to some embodiments of the present disclosure.

Referring to FIG. 6, a package body 30 is disposed or formed to encapsulate the electronic devices 24. The package body 30 further covers the dielectric layer 20, the RDL structure 14 (e.g., the second RDL 18), and the conductive posts 22. The structure illustrated in FIG. 6 is also referred to as overmold assembly. As illustrated in FIG. 6, the conductive posts 22 are embedded in the overmold assembly. In other words, top surfaces of the conductive posts 22 are covered by the package body 30. In some embodiments, the package body 30 may include, for example, one or more organic materials (e.g., molding compound, BT, PI, PBO, solder resist, ABF, PP, epoxy-based material, or a combination of two or more thereof), inorganic materials (e.g., silicon, glass, ceramic, quartz, or a combination of two or more thereof), liquid, dry-film material(s), or a combination of two or more thereof.

Figure 7:
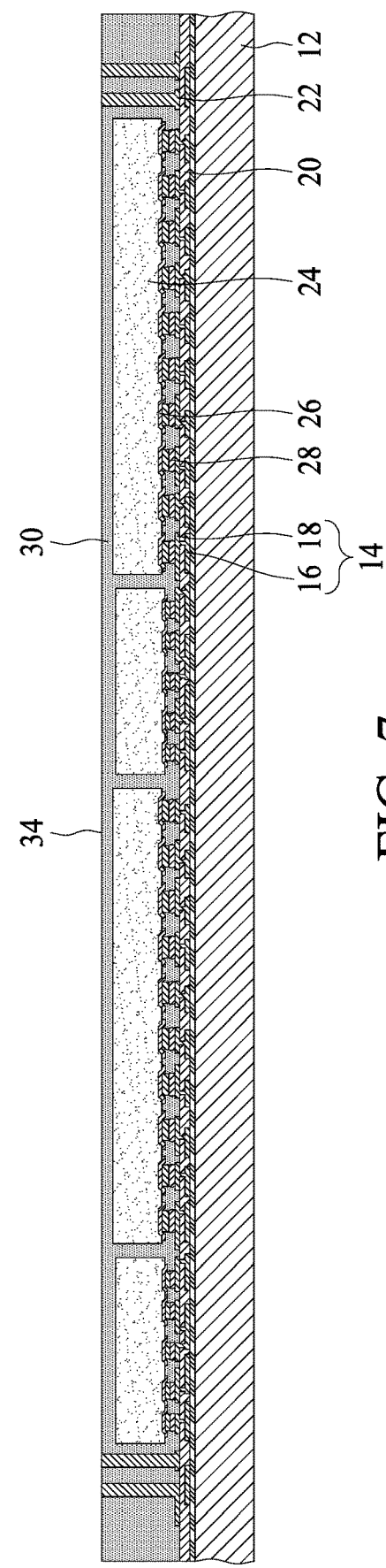
FIG. 7 illustrates one or more stages of a method of manufacturing a stacked semiconductor package assembly according to some embodiments of the present disclosure.

Referring to FIG. 7, a portion of the package body 30 is removed to expose the conductive posts 22. A portion of the package body 30 may be removed using, e.g., grinding, lapping, or another suitable material removal technique. As illustrated in FIG. 7, the package body 30 includes a surface 34, and at least a portion of a terminal end of each conductive post 22 is exposed from the surface 34 of the package body 30. In some embodiments, the terminal end of the conductive post 22 may be substantially co-planar with the surface 34 of the package body 30. Surfaces of the electronic devices 24 are lower than the surface 34 of the package body 30. In other words, the electronic devices 24 remain encapsulated by the package body 30.

Figure 8:
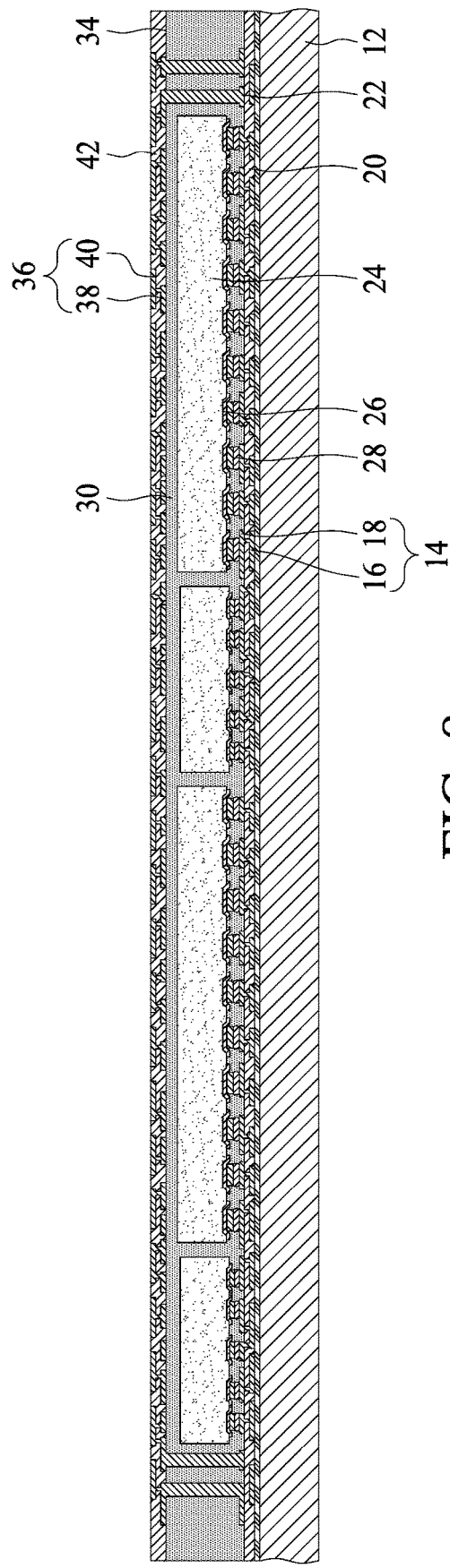
FIG. 8 illustrates one or more stages of a method of manufacturing a stacked semiconductor package assembly according to some embodiments of the present disclosure.

Referring to FIG. 8, another RDL structure 36 is disposed or formed on the surface 34 of the package body 30. In some embodiments, the RDL structure 36 may include one or more RDLs. For example, as illustrated in FIG. 8, the RDL structure 36 may include a first RDL 38 and a second RDL 40 disposed over the first RDL 38. In some embodiments, at least some traces of the first RDL 38 are electrically connected to some traces of the second RDL 40. In some embodiments, the RDL structure 36 includes, e.g., Au, Ag, Ni, Cu, other metal(s) or alloy(s), or a combination of two or more thereof.

The conductive posts 22 may be electrically connected to the RDL structure 36 (e.g., the first RDL 38 of the RDL structure 36). A dielectric layer 42 is disposed to encapsulate at least a portion of the RDL structure 36. In some embodiments, the dielectric layer 42 may include organic material, solder mask, PI, epoxy, ABF, molding compound, or a combination of two or more thereof.

Figure 9:
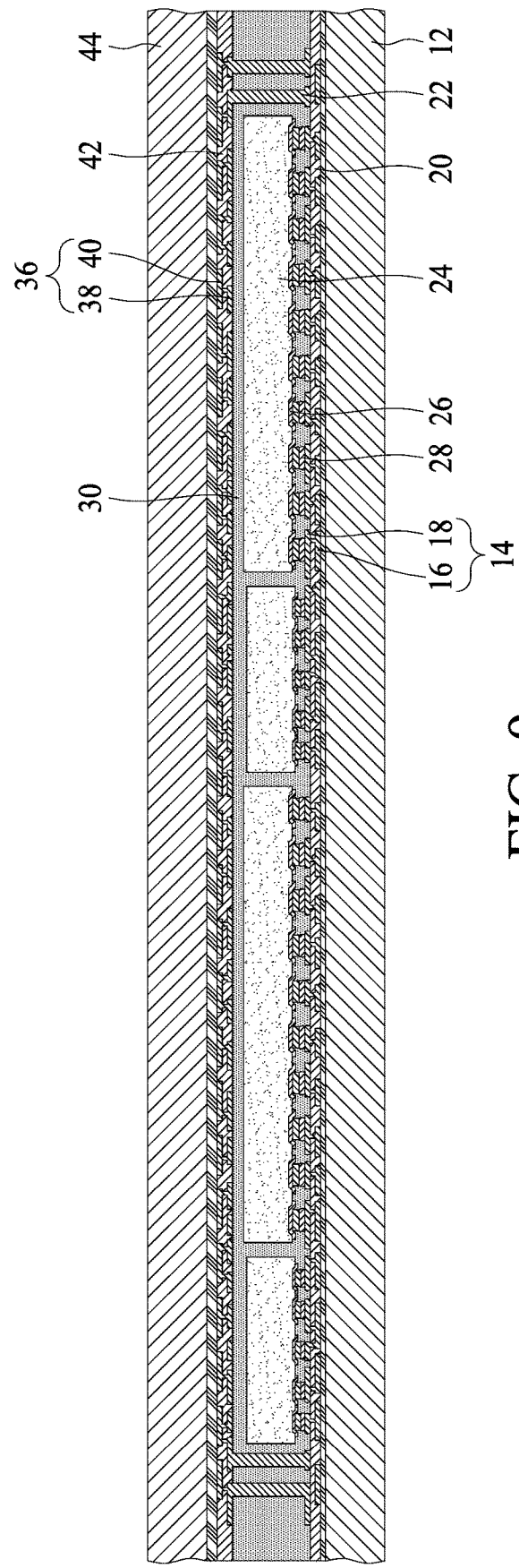
FIG. 9 illustrates one or more stages of a method of manufacturing a stacked semiconductor package assembly according to some embodiments of the present disclosure.

Referring to FIG. 9, a carrier 44 is disposed over the RDL structure 36. For example, the carrier 44 may be bonded to the RDL structure 36 and/or the dielectric layer 42. The carrier 44 can be any of a variety of suitable carriers, such as wafers or panels.

Figure 10:
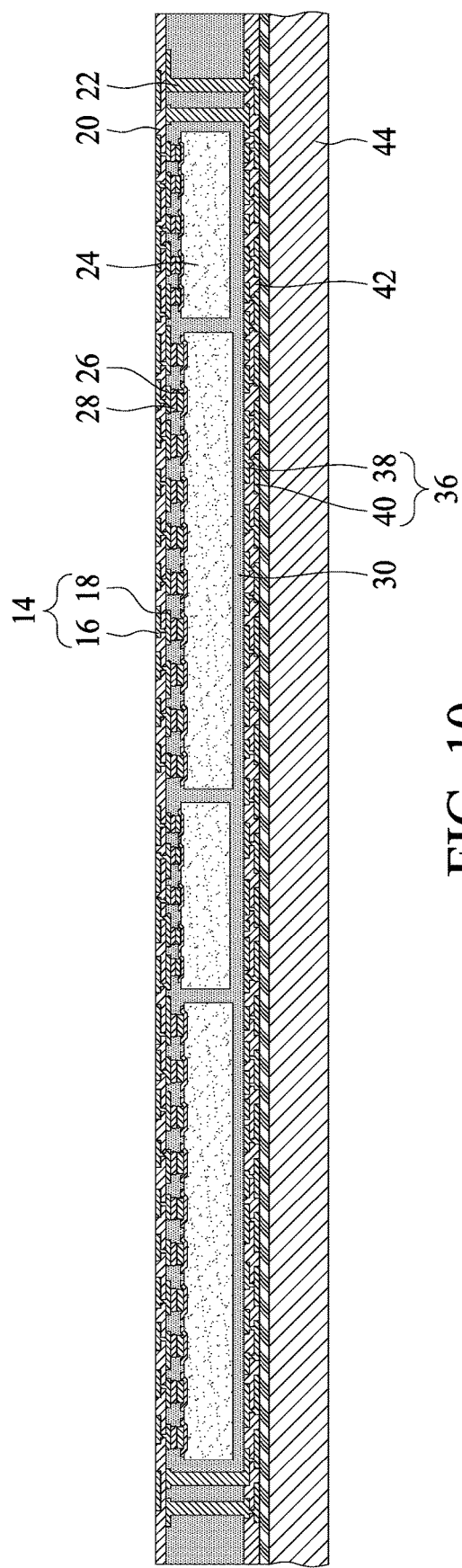
FIG. 10 illustrates one or more stages of a method of manufacturing a stacked semiconductor package assembly according to some embodiments of the present disclosure.

Referred to FIG. 10, the structure shown in FIG. 9 is flipped upside down. The carrier 12 is removed by, e.g., stripping. Thus, traces of the RDL structure 14 (e.g., the first RDL 16 of the RDL structure 14) are exposed.

Figure 11:
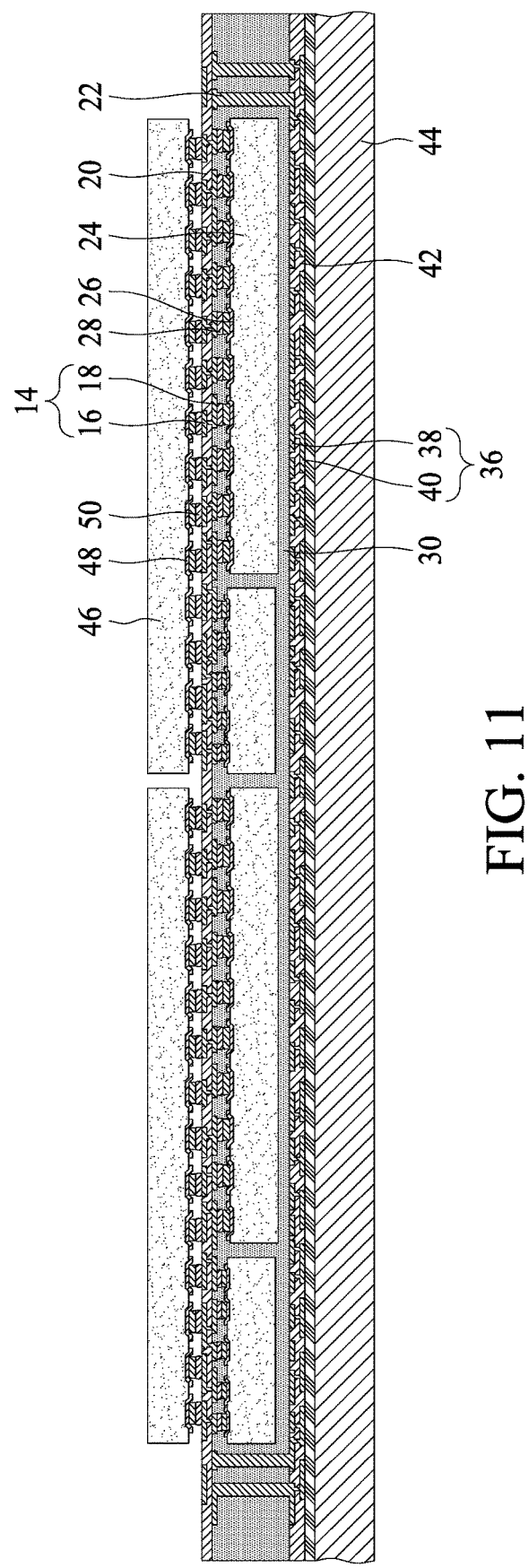
FIG. 11 illustrates one or more stages of a method of manufacturing a stacked semiconductor package assembly according to some embodiments of the present disclosure.

Referred to FIG. 11, one or more electronic devices 46 are disposed over the RDL structure 14 and/or the dielectric layer 20, and are electrically connected to the RDL structure 14 by, e.g., flip-chip mounting. As illustrated in FIG. 11, each of the electronic devices 46 includes contact pads 48 for electrical connections on an active surface (also referred to as active side) of each electronic device 46. In some embodiments, the contact pads 48 may be C4 bumps, a BGA or an LGA.

Connectors 50 are disposed between the contact pads 48 of the electronic devices 46 and the RDL structure 14, and electrically connect the contact pads 48 of the electronic devices 46 to the RDL structure 14 (e.g., the first RDL 16 of the RDL structure 14). The connectors 50 can be, for example, conductive bumps formed from, or including, solder or another conductive material, and/or conductive posts formed from, or including, copper, a copper alloy, or another metal, another metal alloy, or another combination of metals or other conductive materials. As illustrated in FIG. 11, each of the electronic devices 46 may be an active device corresponding to a semiconductor die or chip, although it is contemplated that the electronic devices 46, in general, can be any active devices (semiconductor dies or chips, transistors, etc.), any passive devices (e.g., resistors, capacitors, inductors, transformers, etc.), or a combination of two or more thereof.

Referred to FIG. 12, an underfill 52 may be disposed to cover the active surfaces of the electronic devices 46 and connectors 50. In some embodiments, the underfill 52 includes an epoxy resin, a molding compound (e.g., an epoxy molding compound or other molding compound), a polyimide, a phenolic compound or material, a material including a silicone dispersed therein, or a combination of two or more thereof. In some embodiments, the underfill 52 may be a CUF, a MUF or a dispensing gel, depending on specifications of different embodiments.

Referred to FIG. 13, the carrier 44 is removed by, e.g., stripping. Thus, traces of the RDL structure 36 (e.g., the second RDL 40 of the RDL structure 36) are exposed. Further, connecting elements 54 (e.g., bumps or solder balls) are disposed to electrically connect the RDL structure 36 (e.g., the second RDL 40 of the RDL structure 36) to form the stacked semiconductor assembly 1 (as also illustrated in FIG. 1). In some embodiments, the connecting elements 54 are C4 bumps, BGA or LGA. In some embodiments, the connecting elements 54 can be formed by, e.g., electroplating, electroless plating, sputtering, paste printing, bumping or bonding process. In some embodiments, the connecting elements 54 are conductive pillars (e.g., copper pillars, other metal pillars, or metal-alloy pillars). For example, the stacked semiconductor package 1 may be mounted to and be electrically connected to a circuit board or a substrate through the conductive pillars using, e.g., a flip chip process.

Figure 14:
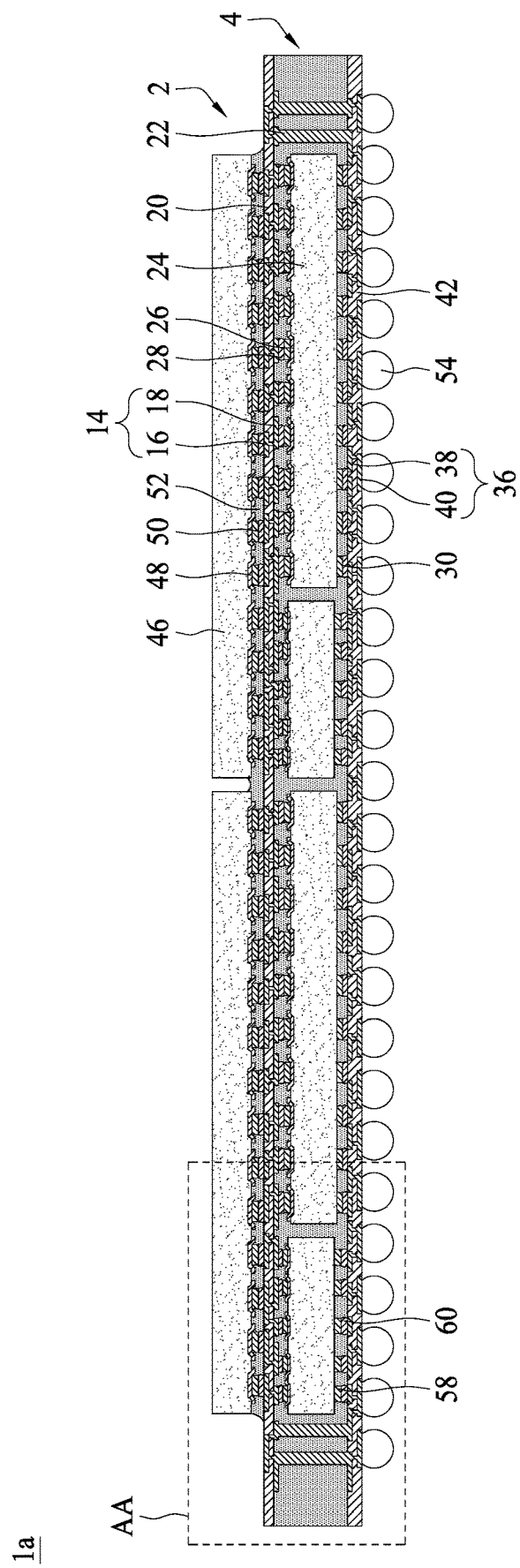
FIG. 14 illustrates a cross-sectional view of a stacked semiconductor package assembly according to some embodiments of the present disclosure.
Figure 14A:
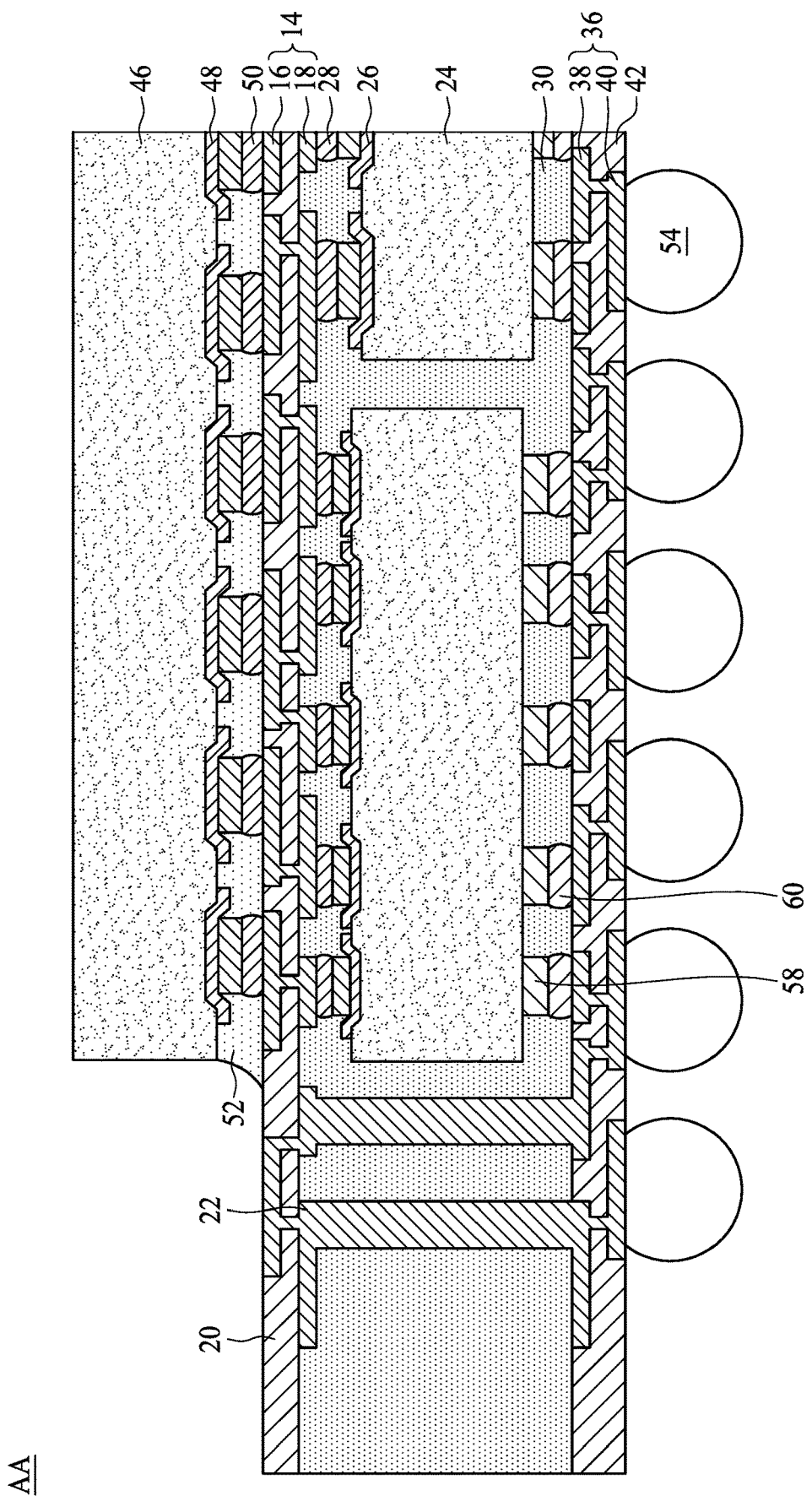
FIG. 14A illustrates an enlarged view of an area AA of FIG. 14.

FIG. 14 illustrates a cross-sectional view of a stacked semiconductor package assembly 1a according to some embodiments of the present disclosure. FIG. 14A illustrates an enlarged view of an area AA of FIG. 14. The stacked semiconductor package assembly 1a of FIGS. 14 and 14A is similar to the stacked semiconductor package assembly 1 of FIGS. 1 and 1A, except that at least one of the bottom electronic devices 24 of the stacked semiconductor package assembly 1a further includes contact pads 26 on a bottom surface facing downward. In other words, in the stacked semiconductor package assembly 1a of FIGS. 14 and 14A, the bottom electronic device 24 has two active surfaces (a top active surface and a bottom active surface). Contact pads 26 are disposed on the top active surface facing upwards, while contact pads 58 are disposed on the bottom active surface facing downward. In some embodiments, the contact pads 58 may be C4 bumps, a BGA or an LGA.

Connectors 60 are disposed between the contact pads 58 of the electronic devices 24 and the RDL structure 36, and electrically connect the contact pads 58 of the electronic devices 24 to the RDL structure 36 (e.g., the first RDL 38 of the RDL structure 36). The connectors 60 can be, for example, conductive bumps formed from, or including, solder or another conductive material, or conductive posts formed from, or including, copper, a copper alloy, or another metal, another metal alloy, or another combination of metals or other conductive materials.

According to at least some embodiments of the present disclosure, instead of communicating with external devices and receiving electrical power through the double sided RDL structure 14, the conductive posts 22, the RDL structure 36 and the connecting elements 54 as shown in FIG. 1, the bottom electronic devices 24 of the stacked semiconductor package assembly 1a can communicate with external devices and receive electrical power through the contact pads 58, the connectors 60, the RDL structure 36 and the connecting elements 54. In other words, because the bottom electronic device 24 has two active surfaces, the bottom electronic device 24 can conduct external communication directly through the RDL structure 36 without using the conductive posts 22.

Figure 15:
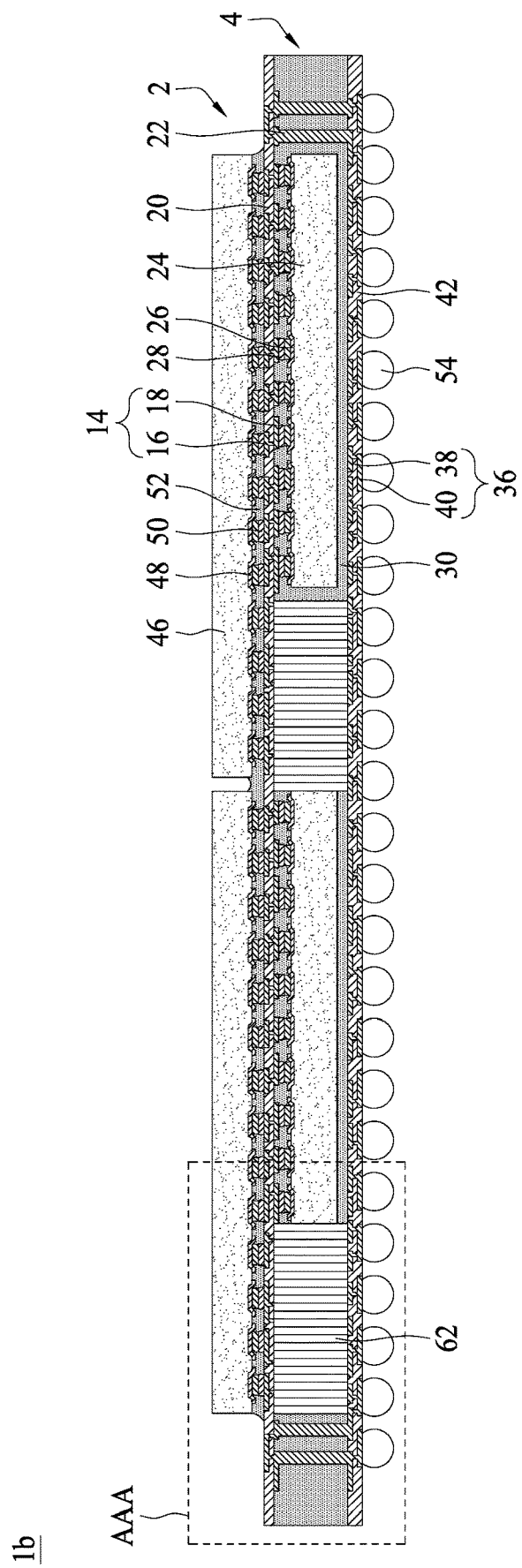
FIG. 15 illustrates a cross-sectional view of a stacked semiconductor package assembly according to some embodiments of the present disclosure.
Figure 15A:
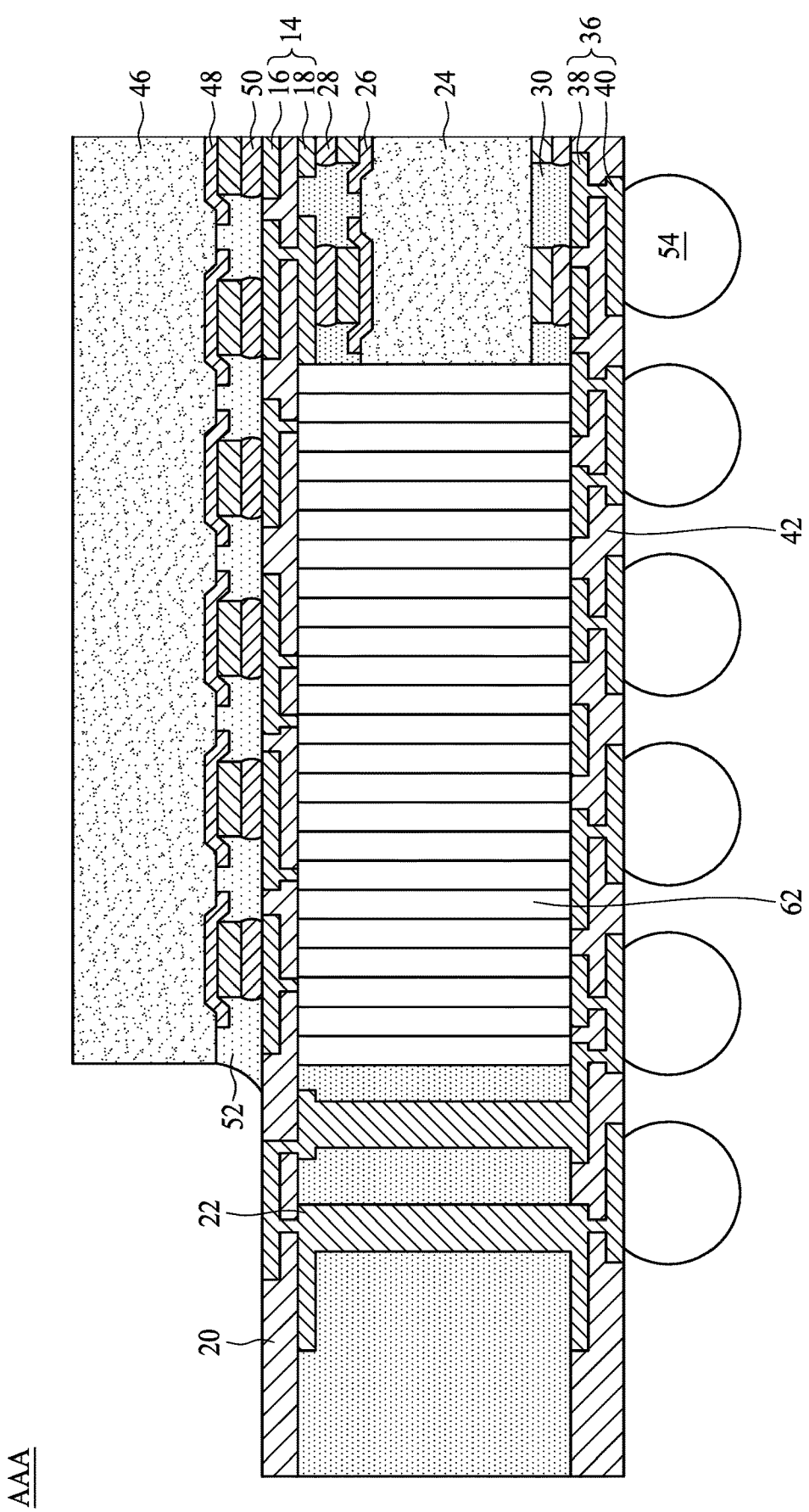
FIG. 15A illustrates an enlarged view of an area AAA of FIG. 15.

FIG. 15 illustrates a cross-sectional view of a stacked semiconductor package assembly 1b according to some embodiments of the present disclosure. FIG. 15A illustrates an enlarged view of an area AAA of FIG. 15. The stacked semiconductor package assembly 1b of FIGS. 15 and 15A is similar to the stacked semiconductor package assembly 1a of FIGS. 14 and 14A, except that at least one of the bottom electronic devices 24 of the stacked semiconductor package assembly 1b is replaced with one or more interposer modules 62, such as one or more through-silicon via (TSV) modules. Each interposer module 62 includes a substrate that can be formed of, or can include, glass, silicon, a metal, a metal alloy, a polymer, or another suitable structural material. Each interposer module 62 also includes a plurality of conductive vias extending from a bottom surface of the interposer module 62 to a top surface of the interposer module 62. The conductive vias can be formed from, or can include, a metal, a metal alloy, a conductive paste, or other conductive material or combination of conductive materials. In some embodiments, a lateral periphery of each conductive via can be generally circular in shape and can have a diameter in a range from about 0.5 µm to about 50 µm, from about 1 µm to about 50 µm, from about 1 µm to about 20 µm, from about 1 µm to about 10 µm, or from about 1 µm to about 3 µm. At least some of the conductive vias of the interposer module 62 electrically interconnect the RDL structure 14 and the RDL structure 36. At least some of the conductive vias may be disposed below the top electronic devices 46.

According to at least some embodiments of the present disclosure, instead of communicating with external devices and receiving electrical power through the double sided RDL structure 14, the conductive posts 22, the RDL structure 36 and the connecting elements 54 as shown in FIGS. 1 and 14, at least one of the top electronic devices 46 and at least one of the bottom electronic devices 24 of the stacked semiconductor package assembly 1b can communicate with external devices and receive electrical power through the RDL structure 14, the interposer module 62, the RDL structure 36 and the connecting elements 54. In other words, due to the interposer module 62, at least one of the top electronic devices 46 and at least one of the bottom electronic devices 24 may conduct external communication through the interposer module 62, in addition to, or in place of, using the conductive posts 22. As compared to the conductive posts 22, the interposer module 62 provides a higher density of interconnections between the RDL structure 14 and the RDL structure 36.

Figure 16:
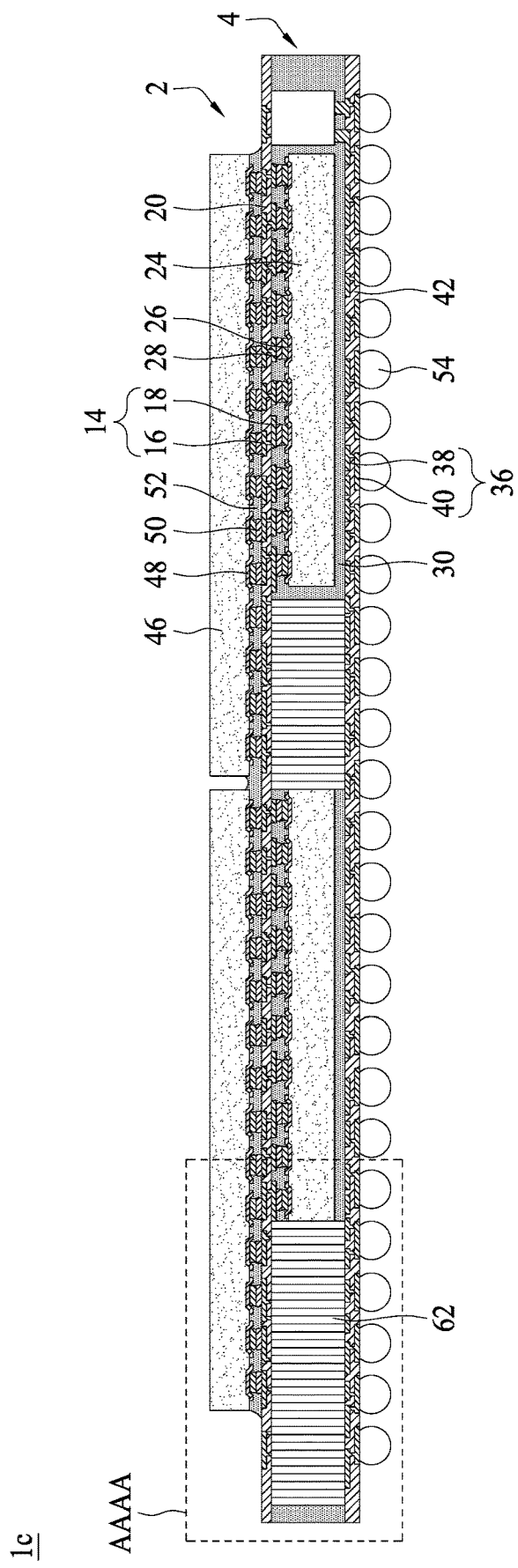
FIG. 16 illustrates a cross-sectional view of a stacked semiconductor package assembly according to some embodiments of the present disclosure.
Figure 16A:
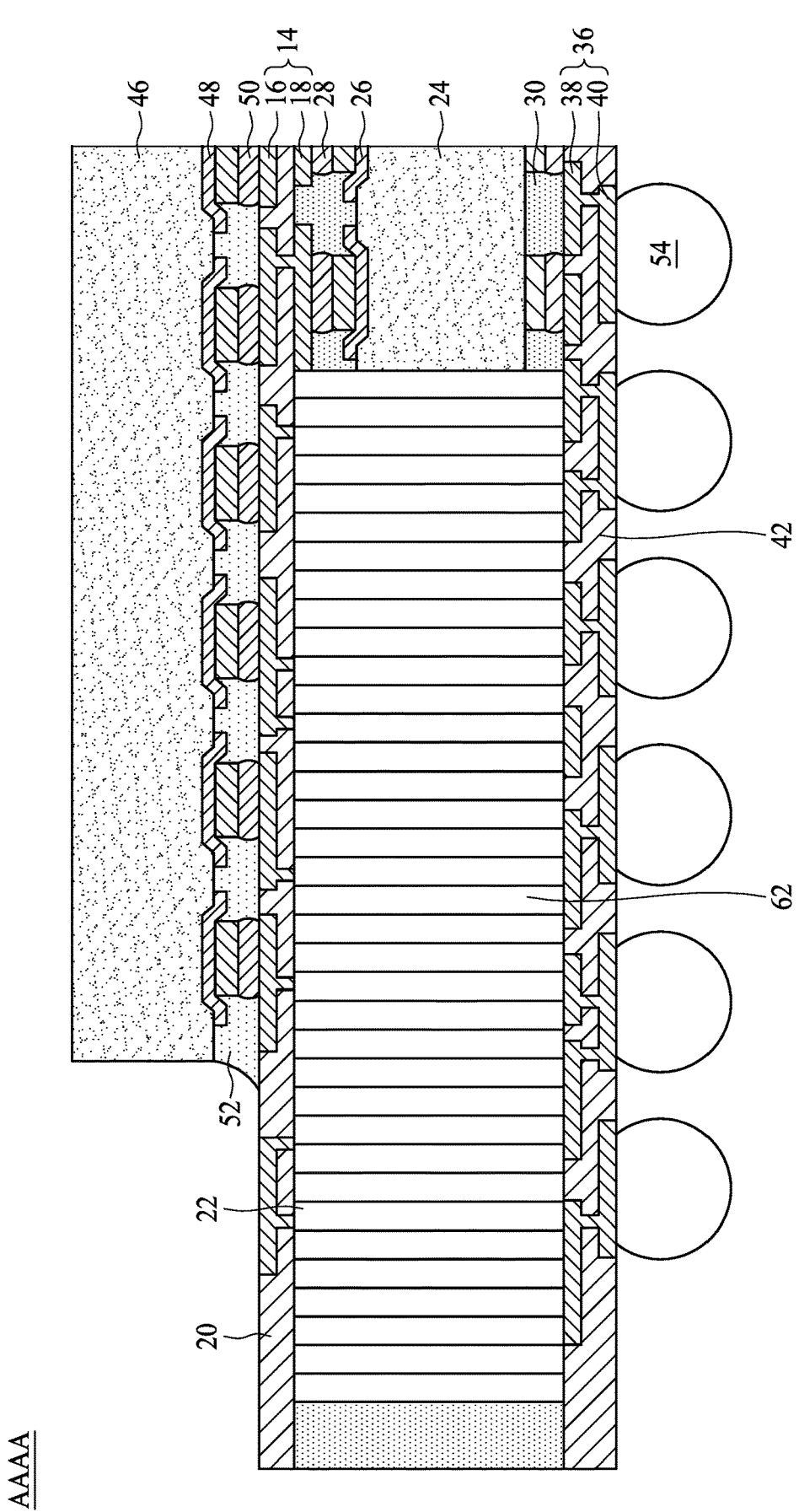
FIG. 16A illustrates an enlarged view of an area AAAA of FIG. 16.

FIG. 16 illustrates a cross-sectional view of a stacked semiconductor package assembly 1c according to some embodiments of the present disclosure. FIG. 16A illustrates an enlarged view of an area AAAA of FIG. 16. The stacked semiconductor package assembly 1c of FIGS. 16 and 16A is similar to the stacked semiconductor package assembly 1b of FIGS. 15 and 15A, except that the conductive posts 22 may be omitted in the stacked semiconductor package assembly 1c of FIGS. 16 and 16A.

According to at least some embodiments of the present disclosure, instead of communicating externally using conductive posts, the top electronic devices 46 and the bottom electronic devices 24 of the stacked semiconductor package assembly 1c communicate with external devices and receive electrical power through the RDL structure 14, the interposer module 62, the RDL structure 36 and the connecting elements 54. Compared to conductive posts, a density of the conductive vias of the interposer module 62 is substantially higher. Furthermore, compared to electrical paths through larger-sized conductive posts that would be spaced further apart from the bottom electronic devices 24, electrical paths through at least some of the conductive vias of the interposer module 62 are shorter.

The disclosed stacked semiconductor package assemblies (e.g., assemblies 1, 1a, 1b and 1c) may be used in various applications. FIG. 17 illustrates a cross-sectional view of a stacked semiconductor package assembly 1700 implemented as a wireless communication front end module (FEM), according to some embodiments of the present disclosure. The stacked semiconductor package assembly 1700 (a wireless communication FEM) includes a top package 2 and a bottom package 4. The top package 2 is stacked on the bottom package 4 and is electrically connected to the bottom package 4 through a double sided RDL structure 14. The top package 2 includes one or more electronic devices such as a power amplifier (PA) and/or switch device 1702 and one or more filters 1704, 1706, and 1708. The filters 1704, 1706, and 1708 may include one or more bulk acoustic wave (BAW) filters or one or more surface acoustic wave (SAW) filters. The bottom package 4 includes one or more electronic devices such as power amplifier (PA) and/or switch devices 1712 and 1714. In some embodiments, the stacked semiconductor package assembly 1700 may be implemented according to, e.g., configurations of stacked semiconductor package assemblies 1, 1a, 1b, or 1c as disclosed.

FIG. 18 illustrates a cross-sectional view of a stacked semiconductor package assembly 1800 implemented as a wireless communication FEM, according to some embodiments of the present disclosure. The stacked semiconductor package assembly 1800 (a wireless communication FEM) includes a top package 2 and a bottom package 4. The top package 2 is stacked on the bottom package 4 and is electrically connected to the bottom package 4 through a double sided RDL structure 14. The top package 2 includes one or more electronic devices such as a PA and/or switch devices 1801 and 1802, and one or more filters 1804, 1806, and 1808. The filters 1804, 1806, and 1808 may include one or more BAW filters or one or more SAW filters. The bottom package 4 includes one or more electronic devices such as PA and/or switch devices 1812 and 1814, as well as one or more filters 1816. The filters 1816 may include one or more BAW filters or one or more SAW filters. In some embodiments, the stacked semiconductor package assembly 1800 may be implemented according to, e.g., configurations of stacked semiconductor package assemblies 1, 1a, 1b, or 1c as disclosed.

Figure 19:
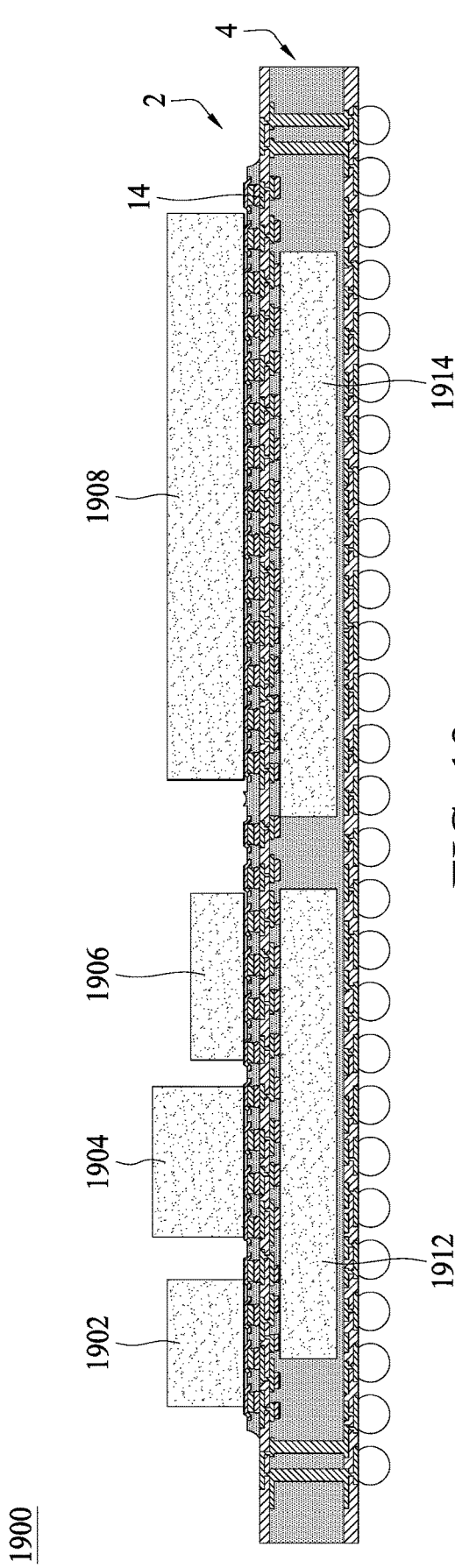
FIG. 19 illustrates a cross-sectional view of a stacked semiconductor package assembly implemented as a system-in-package (SiP), according to some embodiments of the present disclosure.

FIG. 19 illustrates a cross-sectional view of a stacked semiconductor package assembly 1900 implemented as a system-in-package (SiP), according to some embodiments of the present disclosure. The stacked semiconductor package assembly 1900 (a SiP) includes a top package 2 and a bottom package 4. The top package 2 is stacked on the bottom package 4 and is electrically connected to the bottom package 4 through a double sided RDL structure 14. The top package 2 includes one or more electronic devices such as one or more surface mounted devices (SMDs) 1902, 1904, 1906 and a memory 1908. The bottom package 4 includes one or more electronic devices such as a wireless module 1912 (Wi-Fi and/or Bluetooth (BT)) and a microcontroller unit (MCU) 1914. In some embodiments, the stacked semiconductor package assembly 1900 may be implemented according to, e.g., configurations of stacked semiconductor package assemblies 1, 1a, 1b, or 1c as disclosed.

Figure 20:
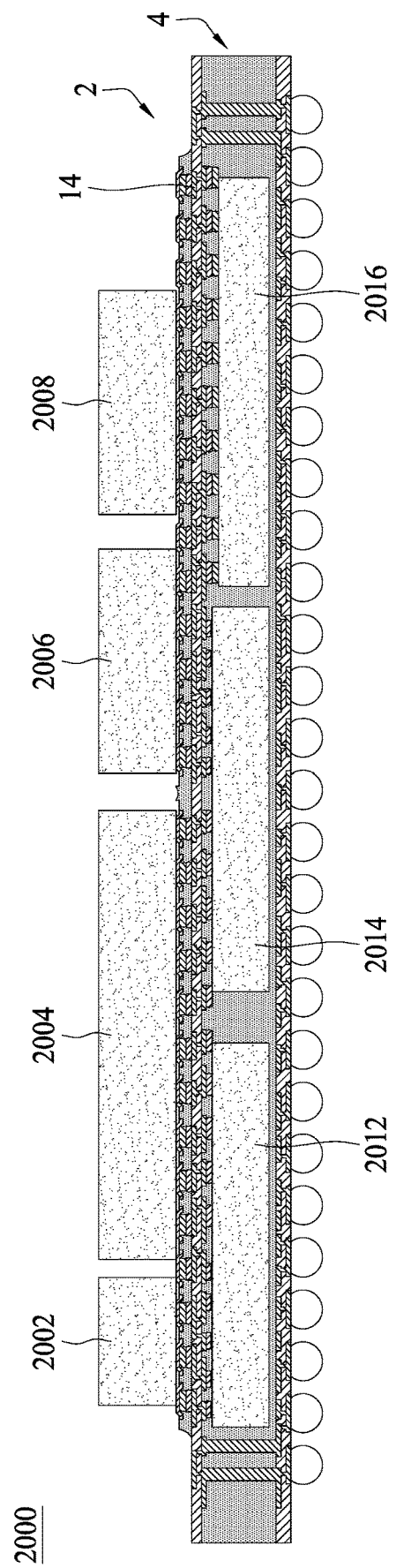
FIG. 20 illustrates a cross-sectional view of a stacked semiconductor package assembly implemented as a SiP, according to some embodiments of the present disclosure.

FIG. 20 illustrates a cross-sectional view of a stacked semiconductor package assembly 2000 implemented as a SiP, according to some embodiments of the present disclosure. The stacked semiconductor package assembly 2000 (a SiP) includes a top package 2 and a bottom package 4. The top package 2 is stacked on the bottom package 4 and is electrically connected to the bottom package 4 through a double sided RDL structure 14. The top package 2 includes one or more electronic devices such as one or more SMDs 2002, a flash memory 2004, a DDR (double data rate) memory 2006 and a sensor 2008. The sensor 2008 may be, e.g., a temperature sensor, a light sensor, a touch sensor, a sound sensor, a pressure sensor, etc. The bottom package 4 includes one or more electronic devices such as wireless module 2012 (Wi-Fi and/or BT), a power management integrated circuit (PMIC) 2014, and a MCU 2016. In some embodiments, the stacked semiconductor package assembly 2000 may be implemented according to, e.g., configurations of stacked semiconductor package assemblies 1, 1a, 1b, or 1c as disclosed.

FIG. 21 illustrates a cross-sectional view of a stacked semiconductor package assembly 2100 implemented as a SiP, according to some embodiments of the present disclosure. The SiP may be, e.g., a display touch SiP. The stacked semiconductor package assembly 2100 (a SiP) includes a top package 2 and a bottom package 4. The top package 2 is stacked on the bottom package 4 and is electrically connected to the bottom package 4 through a double sided RDL structure 14. The top package 2 includes one or more electronic devices such as one or more SMDs 2102, 2104, 2016 and a semiconductor chip or package 2108. The bottom package 4 includes one or more electronic devices such as semiconductor chips 2112 and 2114. In some embodiments, the stacked semiconductor package assembly 2100 may be implemented according to, e.g., configurations of stacked semiconductor package assemblies 1, 1a, 1b, or 1c as disclosed. The stacked semiconductor package assembly 2100 may further include a shielding layer 2110 to cover the devices of the top package 2 and to mitigate against electromagnetic interference. The shielding layer 2110 can be formed from, or can include, a metal, a metal alloy, or other conductive material or combination of conductive materials. The shielding layer 2110 is grounded via an electrical path through the double sided RDL structure 14.

In some embodiments, a stacked semiconductor package assembly may include photonics packages or photonics modules. For example, the semiconductor chip or package 2108 may include one or more photonics packages or photonics modules. In some embodiments, a stacked semiconductor package assembly may include at least one integrated image sensor SiP (e.g., vision sensor SiP) or at least one integrated image sensor assembly (e.g., vision sensor assembly). For example, the semiconductor chip or package 2108 may include one or more integrated image sensor SiPs (e.g., vision sensor SiPs) or integrated image sensor assemblies (e.g., vision sensor assemblies).

FIG. 22 illustrates a cross-sectional view of a stacked semiconductor package assembly 2200 implemented as a networking router or switch, according to some embodiments of the present disclosure. The stacked semiconductor package assembly 2200 (a networking router or switch) includes a top package 2 and a bottom package 4. The top package 2 is stacked on the bottom package 4 and is electrically connected to the bottom package 4 through a double sided RDL structure 14. In some embodiments, a portion of the double sided RDL structure 14 may be implemented as a passive equalizer. The top package 2 includes one or more electronic devices such as a networking processing unit (NPU) 2202. The bottom package 4 includes one or more electronic devices such as a high bandwidth memory (HBM) 2212, a TSV module 2214, and a serializer and/or deserializer (SerDes) 2216. The TSV module 2214 may be substantially the same as, or similar to, the interposer module 62 as illustrated in FIGS. 15 and 15A. In some embodiments, the stacked semiconductor package assembly 2200 may be implemented according to, e.g., configurations of stacked semiconductor package assemblies 1, 1a, 1b, or 1c as disclosed.

Figure 23:
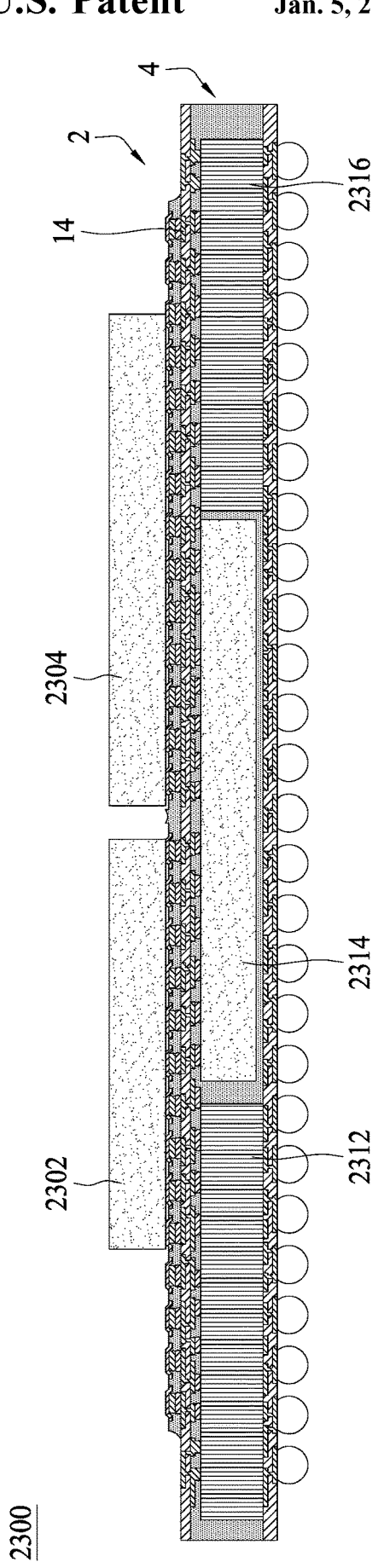
FIG. 23 illustrates a cross-sectional view of a stacked semiconductor package assembly implemented as a networking router or switch, according to some embodiments of the present disclosure.

FIG. 23 illustrates a cross-sectional view of a stacked semiconductor package assembly 2300 implemented as a networking router or switch, according to some embodiments of the present disclosure. The stacked semiconductor package assembly 2300 (a networking router or switch) includes a top package 2 and a bottom package 4. The top package 2 is stacked on the bottom package 4 and is electrically connected to the bottom package 4 through a double sided RDL structure 14. The top package 2 includes one or more electronic devices such as an HBM 2302 and a SerDes 2304. The bottom package 4 includes one or more electronic devices such as a TSV module 2312, an NPU 2314, and another TSV module 2316. The TSV modules 2312 and 2316 may be substantially the same as, or similar to, the interposer module 62 as illustrated in FIGS. 15 and 15A. In some embodiments, the stacked semiconductor package assembly 2300 may be implemented according to, e.g., configurations of stacked semiconductor package assemblies 1, 1a, 1b, or 1c as disclosed. In some embodiments, conductive posts may be omitted as illustrated in FIG. 23.

Figure 24:
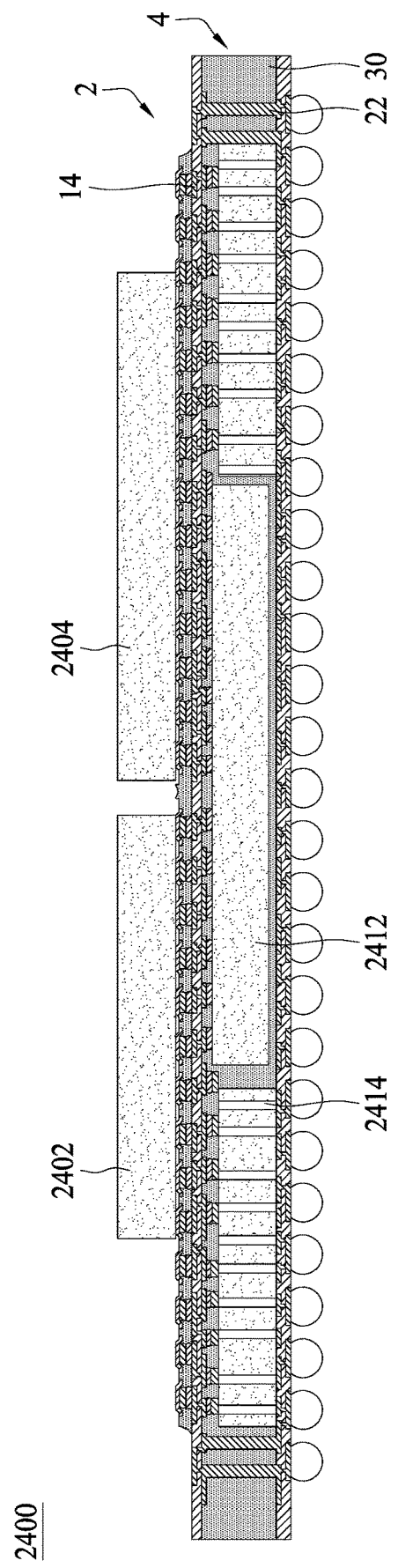
FIG. 24 illustrates a cross-sectional view of a stacked semiconductor package assembly implemented as a networking router or switch, according to some embodiments of the present disclosure.

FIG. 24 illustrates a cross-sectional view of a stacked semiconductor package assembly 2400 implemented as a networking router or switch, according to some embodiments of the present disclosure. The stacked semiconductor package assembly 2400 (a networking router or switch) includes a top package 2 and a bottom package 4. The top package 2 is stacked on the bottom package 4 and is electrically connected to the bottom package 4 through a double sided RDL structure 14. The top package 2 includes one or more electronic devices such as an HBM 2402 and a SerDes 2404. The bottom package 4 includes, e.g., an NPU 2412, and conductive posts 22 and a plurality of TSV modules 2414 are disposed in the package body 30. In some embodiments, the stacked semiconductor package assembly 2400 may be implemented according to, e.g., configurations of stacked semiconductor package assemblies 1, 1a, 1b, or 1c as disclosed. In some embodiments, portions of the double sided RDL structure 14 may be implemented as a memory bus interface, a parallel bus, a serial bus, etc.

Figure 25:
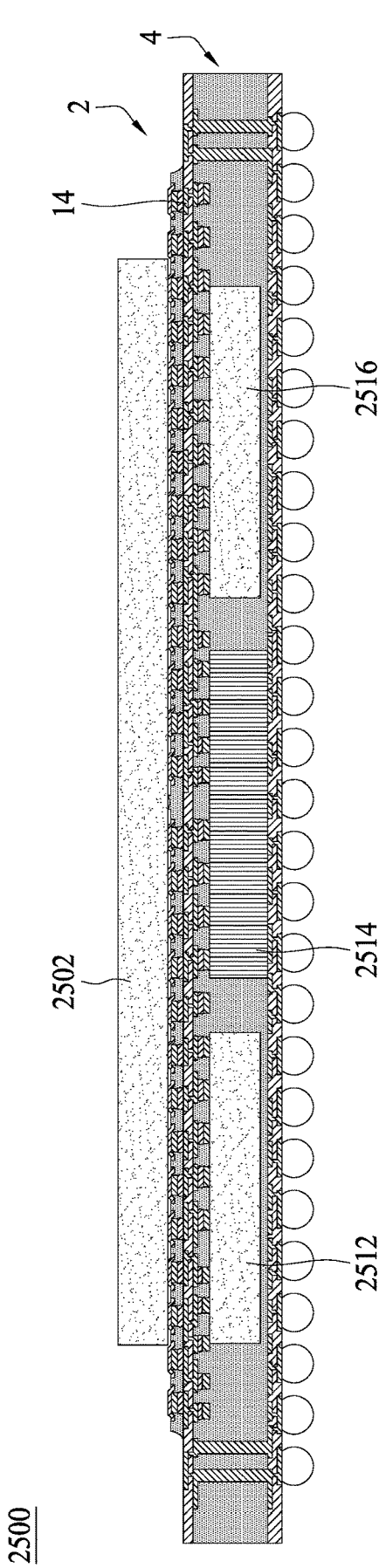
FIG. 25 illustrates a cross-sectional view of a stacked semiconductor package assembly implemented as a graphics adapter, according to some embodiments of the present disclosure.

FIG. 25 illustrates a cross-sectional view of a stacked semiconductor package assembly 2500 implemented as a graphics adapter, according to some embodiments of the present disclosure. The stacked semiconductor package assembly 2500 (a graphics adapter) includes a top package 2 and a bottom package 4. The top package 2 is stacked on the bottom package 4 and is electrically connected to the bottom package 4 through a double sided RDL structure 14. The top package 2 includes one or more electronic devices such as a graphic processing unit (GPU) 2502. The bottom package 4 includes one or more electronic devices such as an HBM 3512, a TSV module 2514, and another HBM 2516. The TSV modules 2514 may be substantially the same as, or similar to, the TSV module 62 as illustrated in FIGS. 15 and 15A. In some embodiments, the stacked semiconductor package assembly 2500 may be implemented according to, e.g., configurations of stacked semiconductor package assemblies 1, 1a, 1b, or 1c as disclosed. In some embodiments, due to the high bandwidth specification, the GPU 2502 specifies a large number of electrical connections to external devices. The conductive posts may not meet the specification for the number of electrical connections. Instead, because of the high density of TSVs, the TSV module 2514 allows the GPU 2502 to have the specified number of electrical connections with external devices.

Figure 26:
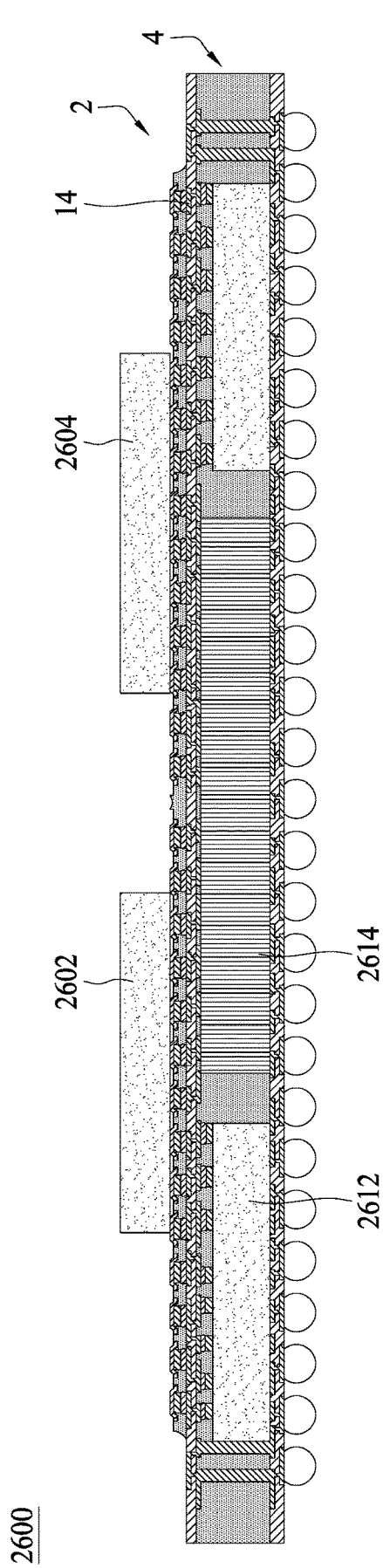
FIG. 26 illustrates a cross-sectional view of a stacked semiconductor package assembly implemented as a high bandwidth memory adapter, according to some embodiments of the present disclosure.

FIG. 26 illustrates a cross-sectional view of a stacked semiconductor package assembly 2600 implemented as a high bandwidth memory adapter, according to some embodiments of the present disclosure. The stacked semiconductor package assembly 2600 (a high bandwidth memory adapter) includes a top package 2 and a bottom package 4. The top package 2 is stacked on the bottom package 4 and is electrically connected to the bottom package 4 through a double sided RDL structure 14. The top package 2 includes one or more electronic devices such as HBMs 2602 and 2604. The bottom package 4 includes one or more electronic devices such as a chip 2612 and a TSV module 2614. The chip 2612 may be, e.g., a GPU or a three-dimensional (3D) processing unit. The TSV modules 2614 may be substantially the same as, or similar to, the TSV module 62 as illustrated in FIGS. 15 and 15A. In some embodiments, the stacked semiconductor package assembly 2600 may be implemented according to, e.g., configurations of stacked semiconductor package assemblies 1, 1a, 1b, or 1c as disclosed. In some embodiments, due to the high bandwidth specification, the HBMs 2602 specifies a large number of electrical connections to external devices. The conductive posts may not meet the specification for the number of electrical connections. Instead, because of the high density of TSVs, the TSV module 2614 allows the HBMs 2602 and 2604 to have the specified number of electrical connections with external devices.

Figure 27:
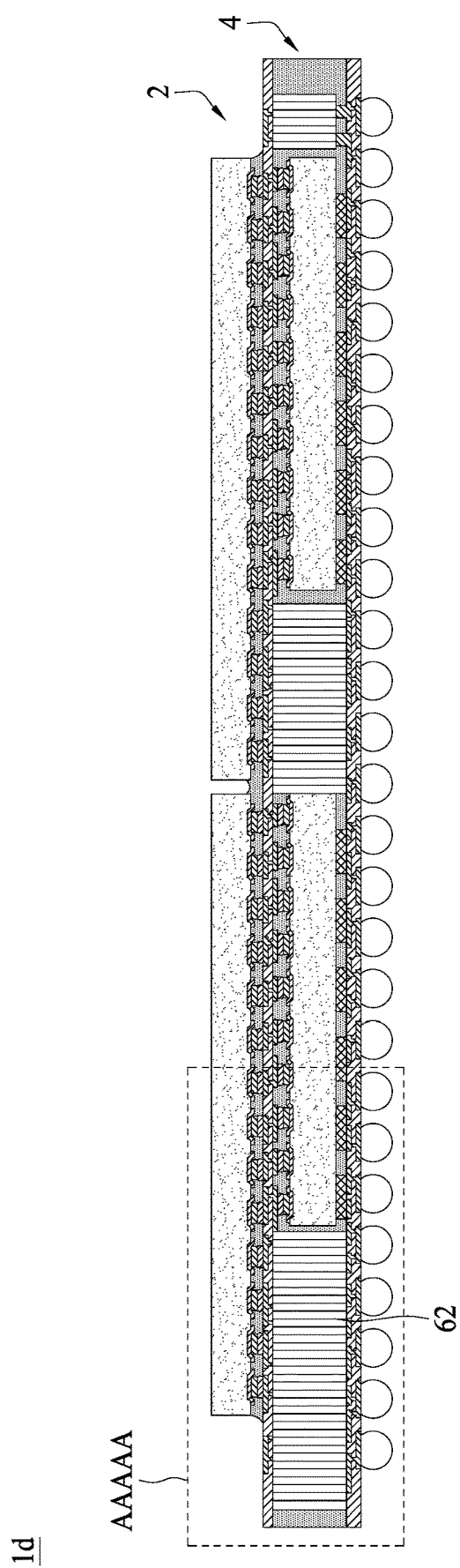
FIG. 27 illustrates a cross-sectional view of a stacked semiconductor package assembly according to some embodiments of the present disclosure.
Figure 27A:
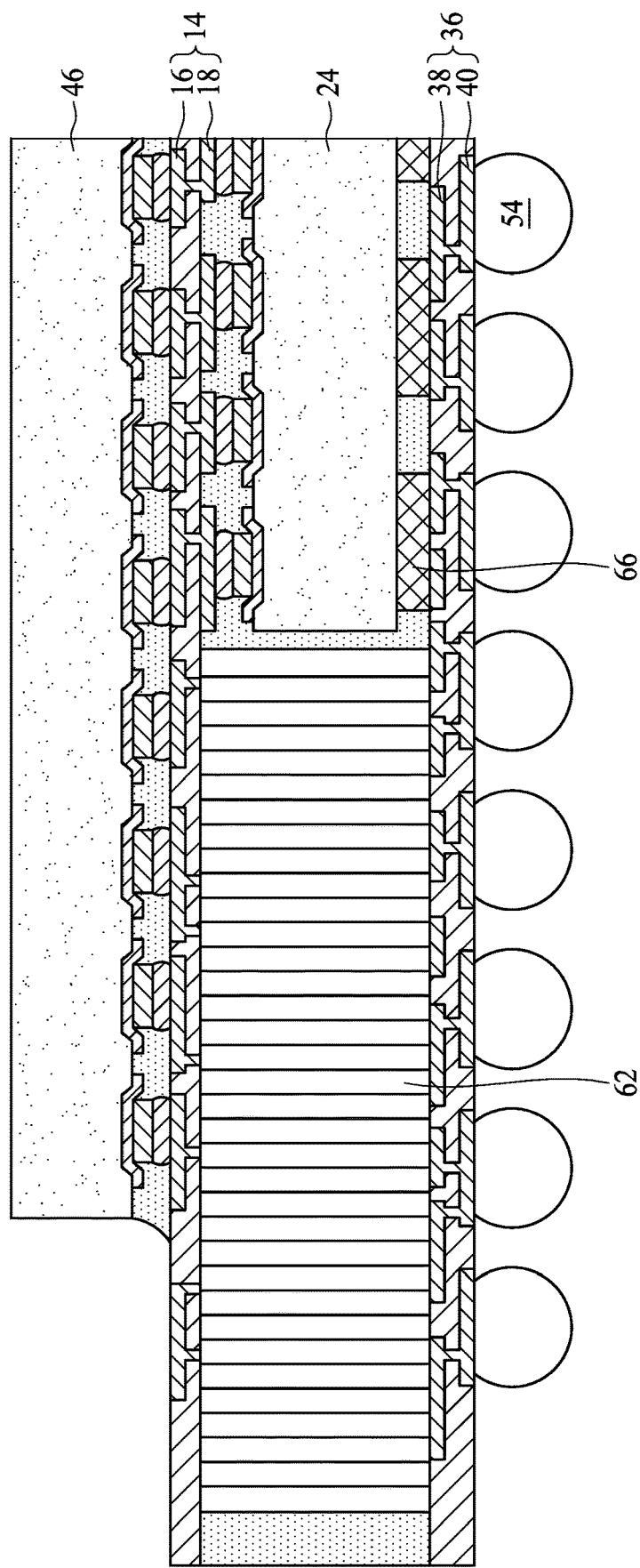
FIG. 27A illustrates an enlarged view of an area AAAAA of FIG. 27.

In some embodiments, a stacked semiconductor package assembly may include thermal conducting components. FIG. 27 illustrates a cross-sectional view of a stacked semiconductor package assembly 1d according to some embodiments of the present disclosure. FIG. 27A illustrates an enlarged view of an area AAAAA of FIG. 27. The stacked semiconductor package assembly 1d of FIGS. 27 and 27A is similar to the stacked semiconductor package assembly 1 of FIGS. 1 and 1A, except that the bottom package 4 of the stacked semiconductor package assembly 1d includes one or more interposer modules 62 instead of conductive posts 22 and that the bottom package 4 includes one or more thermal conducting components 66.

In some embodiments, a top surface of the interposer module 62 contacts the RDL structure 14 and a bottom surface of the interposer module 62 contacts the RDL structure 36. In other words, the interposer module 62 electrically connects the RDL structure 14 to the RDL structure 36.

The bottom package 4 further includes one or more thermal conducting components 66 disposed between the electronic devices 24 and the RDL structure 36. Thus, the thermal conductive components 66 may dissipate at least some of the heat energy generated by the electronic devices 24. The thermal conductive components 66 can be formed from, or can include, a metal, a metal alloy, solder, or other material or combination of materials.

FIGS. 28-37 illustrate various stages of a method of manufacturing a stacked semiconductor package assembly 1d according to some embodiments of the present disclosure. The manufacturing method can be referred to as a "chip last" method. Referring to FIG. 28, a temporary carrier 12 is provided. The carrier 12 can be any of a variety of suitable carriers, such as wafers or panels.

Referring to FIG. 29, a RDL structure 14 is disposed or formed over the temporary carrier 12. In some embodiments, the RDL structure 14 may include one or more RDLs. For example, as illustrated in FIG. 29, the RDL structure 14 may include a first RDL 16 and a second RDL 18 disposed over the first RDL 16. In some embodiments, at least some traces of the first RDL 16 are electrically connected to some traces of the second RDL 18. In some embodiments, the RDL structure 14 includes, e.g., Au, Ag, Ni, Cu, other metal(s) or alloy(s), or a combination of two or more thereof.

A dielectric layer 20 is disposed to encapsulate at least a portion of the RDL structure 14. For example, as illustrated in FIG. 29, the dielectric layer 20 encapsulates the RDL 16 and exposes the RDL 18. In some embodiments, the dielectric layer 20 may include organic material, solder mask, PI, epoxy, ABF, molding compound, or a combination of two or more thereof. According to the "chip last" method, the RDL structure 14 can be tested to verify it is free of defects, prior to mounting electronic devices to the RDL structure 14.

Figure 30:
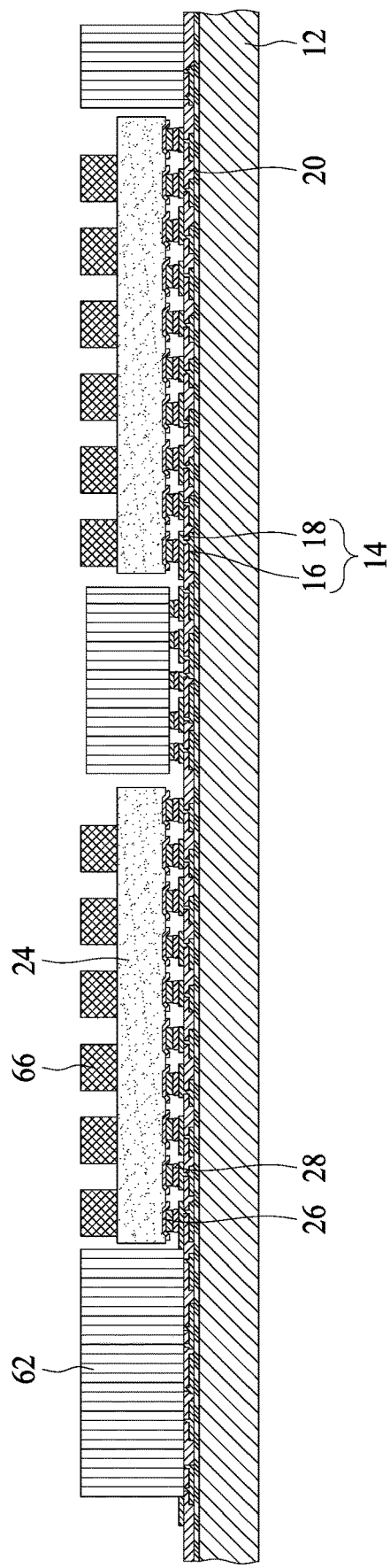
FIG. 30 illustrates one or more stages of a method of manufacturing a stacked semiconductor package assembly according to some embodiments of the present disclosure.

Referring to FIG. 30, one or more interposer modules 62 are disposed over the RDL structure 14. The interposer modules 62 may be electrically connected to the RDL structure 14 (e.g., the second RDL 18 of the RDL structure 14) by, e.g., flip-chip mounting. In some embodiments, conductive vias of the TSV modules 62 may include, e.g., Au, Ag, Ni, Cu, other metal(s) or alloy(s), or a combination of two or more thereof.

Furthermore, one or more electronic devices 24 are disposed over the RDL structure 14 and the dielectric layer 20, and are electrically connected to the RDL structure 14 by, e.g., flip-chip mounting. As illustrated in FIG. 30, each of the electronic devices 24 includes contact pads 26 for electrical connections. In some embodiments, the contact pads 26 may be C4 bumps, a BGA or an LGA.

Connectors 28 are disposed between the contact pads 26 of the electronic devices 24 and the RDL structure 14, and electrically connect the contact pads 26 of the electronic devices 24 to the RDL structure 14 (e.g., the second RDL 18 of the RDL structure 14). The connectors 28 can be, for example, conductive bumps formed from, or including, solder or another conductive material, and/or conductive posts formed from, or including, copper, a copper alloy, or another metal, another metal alloy, or another combination of metals or other conductive materials. As illustrated in FIG. 30, each of the electronic devices 24 may be an active device corresponding to a semiconductor die or chip, although it is contemplated that the electronic devices 24, in general, can be any active devices (semiconductor dies or chips, transistors, etc.), any passive devices (e.g., resistors, capacitors, inductors, transformers, etc.), or a combination of two or more thereof.

Thermal conducting components 66 may be disposed over the electronic devices 24. The thermal conducting components 66 may directly contact top surfaces of the electronic devices 24 for heat dissipation. In some embodiments, the thermal conducting components 66 may be omitted.

Figure 31:
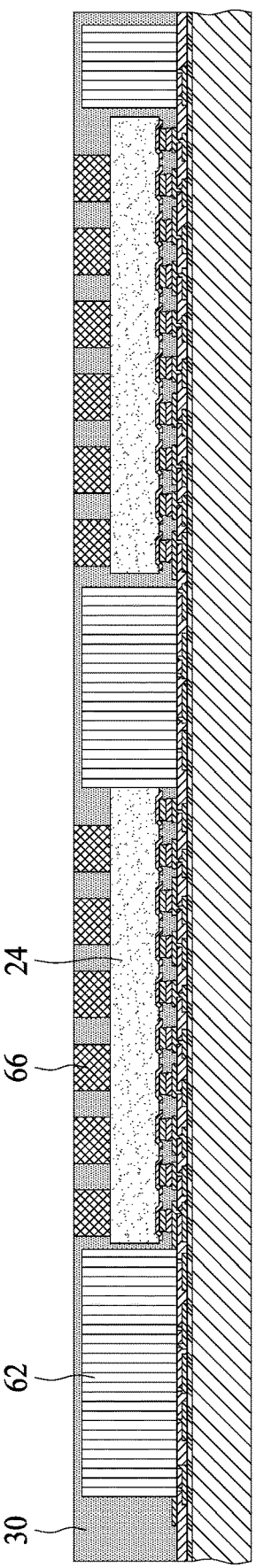
FIG. 31 illustrates one or more stages of a method of manufacturing a stacked semiconductor package assembly according to some embodiments of the present disclosure.

Referring to FIG. 31, a package body 30 is disposed or formed to encapsulate the electronic devices 24, the interposer modules 62 and the thermal conducting components 66. The structure of FIG. 31 is also referred to as overmold assembly. As illustrated in FIG. 31, the interposer modules 62 are embedded in the package body 30. In other words, top surfaces of the interposer modules 62 are covered by the package body 30. In some embodiments, the package body 30 may include, for example, one or more organic materials (e.g., molding compound, BT, PI, PBO, solder resist, ABF, PP, epoxy-based material, or a combination of two or more thereof), inorganic materials (e.g., silicon, glass, ceramic, quartz, or a combination of two or more thereof), liquid, dry-film material(s), or a combination of two or more thereof.

Figure 32:
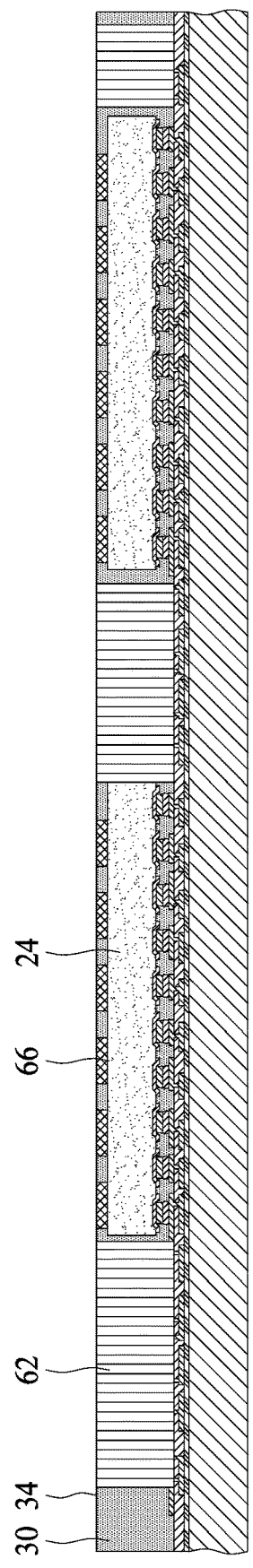
FIG. 32 illustrates one or more stages of a method of manufacturing a stacked semiconductor package assembly according to some embodiments of the present disclosure.

Referring to FIG. 32, a portion of the package body 30 is removed to expose the interposer modules 62. A portion of the package body 30 may be removed using, e.g., grinding, lapping, or another suitable material removal technique. As illustrated in FIG. 32, the package body 30 includes a surface 34, and at least a portion of a terminal end of each conductive via of the interposer module 62 is exposed from the surface 34 of the package body 30. In some embodiments, the terminal end of the conductive via may be substantially co-planar with the surface 34 of the package body 30. Similarly, a top surface of the thermal conducting components 66 may be substantially co-planar with the surface 34 of the package body 30. Surfaces of the electronic devices 24 are lower than the surface 34 of the package body 30. In other words, the electronic devices 24 remain encapsulated by the package body 30.

Figure 33:
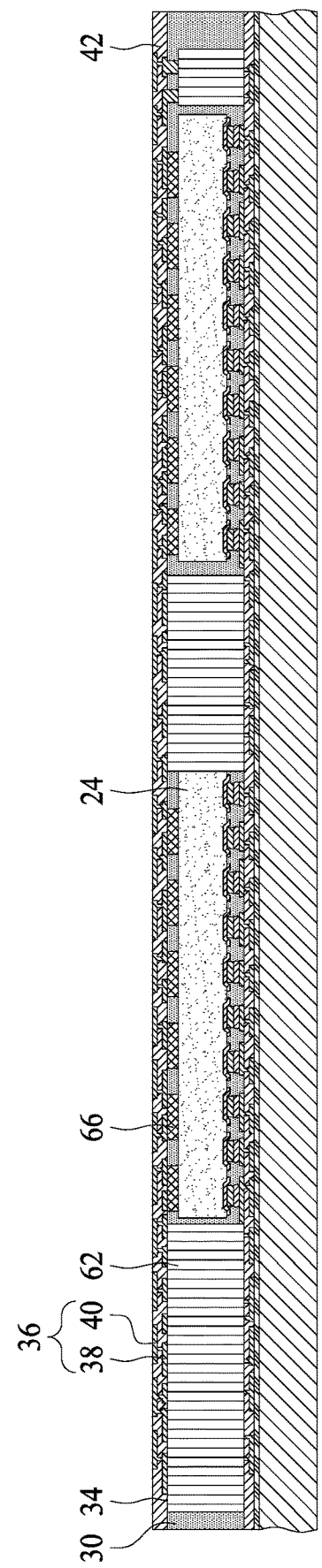
FIG. 33 illustrates one or more stages of a method of manufacturing a stacked semiconductor package assembly according to some embodiments of the present disclosure.

Referring to FIG. 33, another RDL structure 36 is disposed or formed on the surface 34 of the package body 30. In some embodiments, the RDL structure 36 may include one or more RDLs. For example, as illustrated in FIG. 33, the RDL structure 36 may include a first RDL 38 and a second RDL 40 disposed over the first RDL 38. In some embodiments, at least some traces of the first RDL 38 are electrically connected to some traces of the second RDL 40. In some embodiments, the RDL structure 36 includes, e.g., Au, Ag, Ni, Cu, other metal(s) or alloy(s), or a combination of two or more thereof.

The interposer modules 62 may be electrically connected to the RDL structure 36 (e.g., the first RDL 38 of the RDL structure 36). The thermal conducting components 66 may contact a portion of the RDL structure 36 (e.g., the first RDL 38 of the RDL structure 36). A dielectric layer 42 is disposed or formed to encapsulate at least a portion of the RDL structure 36. In some embodiments, the dielectric layer 42 may include organic material, solder mask, PI, epoxy, ABF, molding compound, or a combination of two or more thereof.

Figure 34:
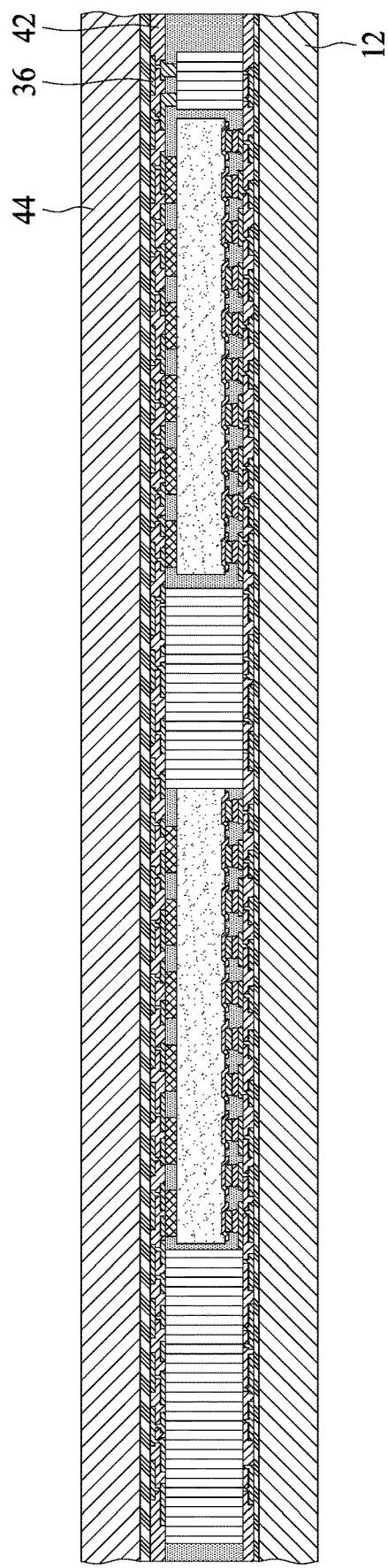
FIG. 34 illustrates one or more stages of a method of manufacturing a stacked semiconductor package assembly according to some embodiments of the present disclosure.

Referring to FIG. 34, a carrier 44 is disposed over the RDL structure 36. For example, the carrier 44 may be bonded to the RDL structure 36 and/or the dielectric layer 42. The carrier 44 can be any of a variety of suitable carriers, such as wafers or panels.

Figure 35:
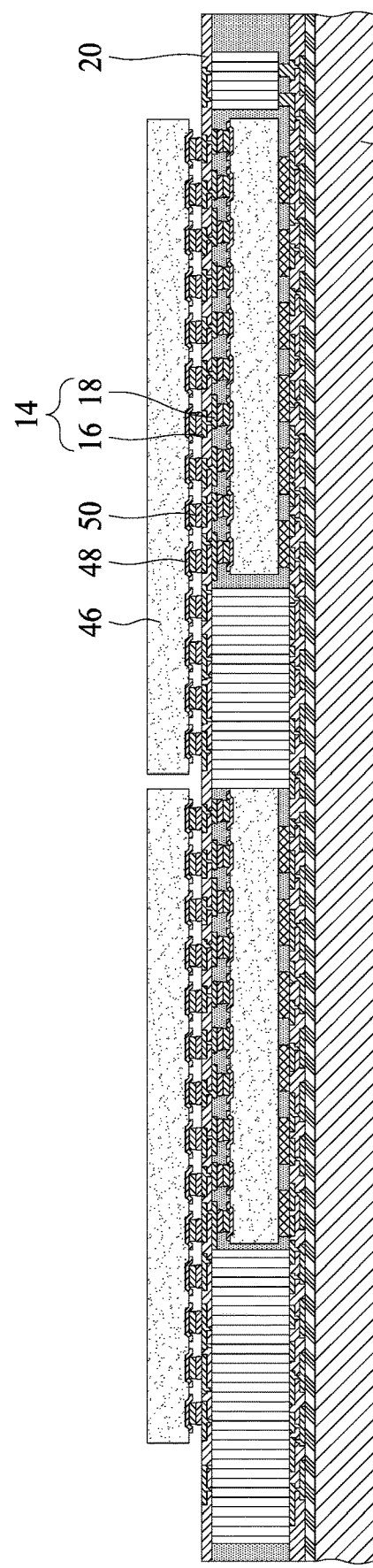
FIG. 35 illustrates one or more stages of a method of manufacturing a stacked semiconductor package assembly according to some embodiments of the present disclosure.

Referred to FIG. 35, the structure shown in FIG. 34 is flipped upside down. The carrier 12 is removed by, e.g., stripping. Thus, traces of the RDL structure 14 (e.g., the first RDL 16 of the RDL structure 14) are exposed.

Furthermore, one or more electronic devices 46 are disposed over the RDL structure 14 and/or the dielectric layer 20, and are electrically connected to the RDL structure 14 by, e.g., flip-chip mounting. As illustrated in FIG. 35, each of the electronic devices 46 includes contact pads 48 for electrical connections on an active surface (also referred to as active side) of each electronic device 46. In some embodiments, the contact pads 48 may be C4 bumps, a BGA or an LGA.

Connectors 50 are disposed between the contact pads 48 of the electronic devices 46 and the RDL structure 14, and electrically connect the contact pads 48 of the electronic devices 46 to the RDL structure 14 (e.g., the first RDL 16 of the RDL structure 14). The connectors 50 can be, for example, conductive bumps formed from, or including, solder or another conductive material, and/or conductive posts formed from, or including, copper, a copper alloy, or another metal, another metal alloy, or another combination of metals or other conductive materials. As illustrated in FIG. 35, each of the electronic devices 46 may be an active device corresponding to a semiconductor die or chip, although it is contemplated that the electronic devices 46, in general, can be any active devices (semiconductor dies or chips, transistors, etc.), any passive devices (e.g., resistors, capacitors, inductors, transformers, etc.), or a combination of two or more thereof.

Figure 36:
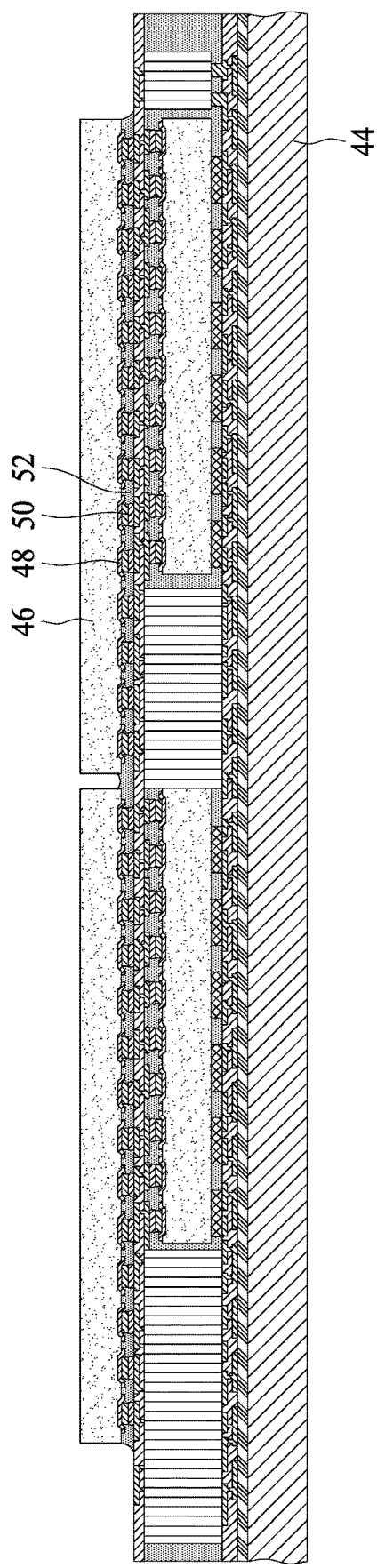
FIG. 36 illustrates one or more stages of a method of manufacturing a stacked semiconductor package assembly according to some embodiments of the present disclosure.

Referred to FIG. 36, an underfill 52 may be disposed to cover the active surfaces of the electronic devices 46 and connectors 50. In some embodiments, the underfill 52 includes an epoxy resin, a molding compound (e.g., an epoxy molding compound or other molding compound), a polyimide, a phenolic compound or material, a material including a silicone dispersed therein, or a combination of two or more thereof. In some embodiments, the underfill 52 may be a CUF, a MUF or a dispensing gel, depending on specifications of different embodiments.

Figure 37:
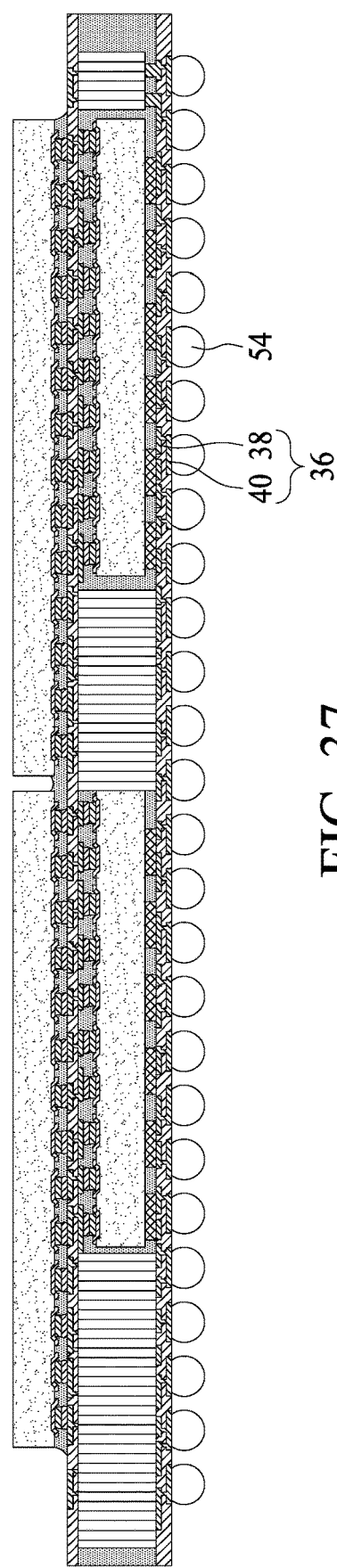
FIG. 37 illustrates one or more stages of a method of manufacturing a stacked semiconductor package assembly according to some embodiments of the present disclosure.

Referred to FIG. 37, the carrier 44 is removed by, e.g., stripping. Thus, traces of the RDL structure 36 (e.g., the second RDL 40 of the RDL structure 36) are exposed. Further, connecting elements 54 (e.g., bumps or solder balls) are disposed to electrically connect the RDL structure 36 (e.g., the second RDL 40 of the RDL structure 36) to form the stacked semiconductor assembly 1d (as also illustrated in FIGS. 27 and 27A). In some embodiments, the connecting elements 54 are C4 bumps, BGA or LGA. In some embodiments, the connecting elements 54 can be formed by, e.g., electroplating, electroless plating, sputtering, paste printing, bumping or bonding process. In some embodiments, the connecting elements 54 are conductive pillars (e.g., copper pillars, other metal pillars, or metal-alloy pillars). For example, the stacked semiconductor package may be mounted to and be electrically connected to a circuit board or a substrate through the conductive pillars using, e.g., a flip chip process.

Figure 38:
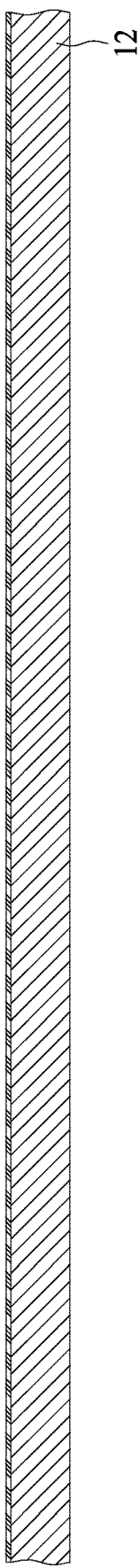
FIG. 38 illustrates one or more stages of a method of manufacturing a stacked semiconductor package assembly according to some embodiments of the present disclosure.

In some embodiments, a stacked semiconductor package assembly may include both, or either of, conductive posts and interposer modules. FIGS. 38-48 illustrate various stages of a method of manufacturing a stacked semiconductor package assembly according to some embodiments of the present disclosure. The manufacturing method can be referred to as a "chip last" method. Referring to FIG. 38, a temporary carrier 12 is provided. The carrier 12 can be any of a variety of suitable carriers, such as wafers or panels.

Figure 39:
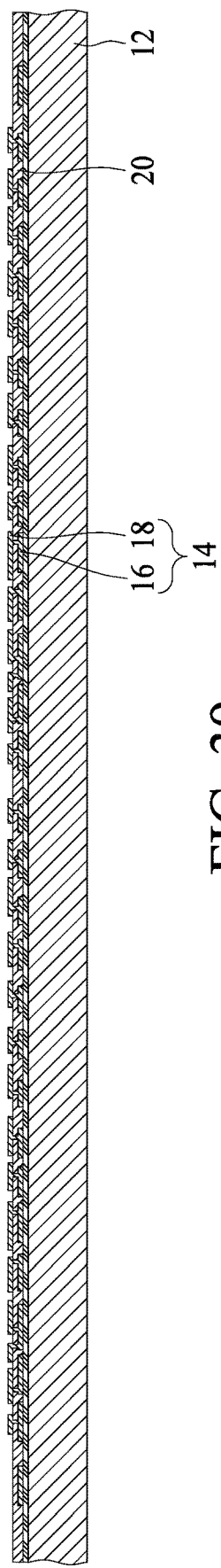
FIG. 39 illustrates one or more stages of a method of manufacturing a stacked semiconductor package assembly according to some embodiments of the present disclosure.

Referring to FIG. 39, a RDL structure 14 is disposed or formed over the temporary carrier 12. In some embodiments, the RDL structure 14 may include one or more RDLs. For example, as illustrated in FIG. 39, the RDL structure 14 may include a first RDL 16 and a second RDL 18 disposed over the first RDL 16. In some embodiments, at least some traces of the first RDL 16 are electrically connected to some traces of the second RDL 18. In some embodiments, the RDL structure 14 includes, e.g., Au, Ag, Ni, Cu, other metal(s) or alloy(s), or a combination of two or more thereof.

A dielectric layer 20 is disposed or formed to encapsulate at least a portion of the RDL structure 14. For example, as illustrated in FIG. 39, the dielectric layer 20 encapsulates the RDL 16 and exposes the RDL 18. In some embodiments, the dielectric layer 20 may include organic material, solder mask, PI, epoxy, ABF, molding compound, or a combination of two or more thereof.

Figure 40:
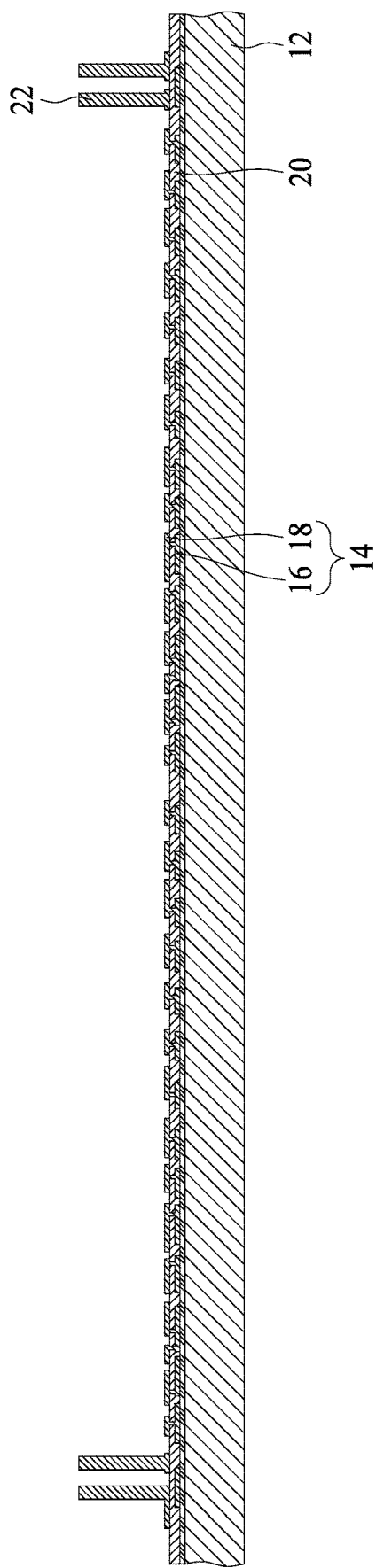
FIG. 40 illustrates one or more stages of a method of manufacturing a stacked semiconductor package assembly according to some embodiments of the present disclosure.

Referring to FIG. 40, one or more conductive posts 22 are disposed or formed over the RDL structure 14. In some embodiments, the conductive posts 22 are disposed over a periphery of the RDL structure 14. The conductive posts 22 may be electrically connected to the RDL structure 14 (e.g., the second RDL 18 of the RDL structure 14). In some embodiments, the conductive posts 22 include, e.g., Au, Ag, Ni, Cu, other metal(s) or alloy(s), or a combination of two or more thereof.

Figure 41:
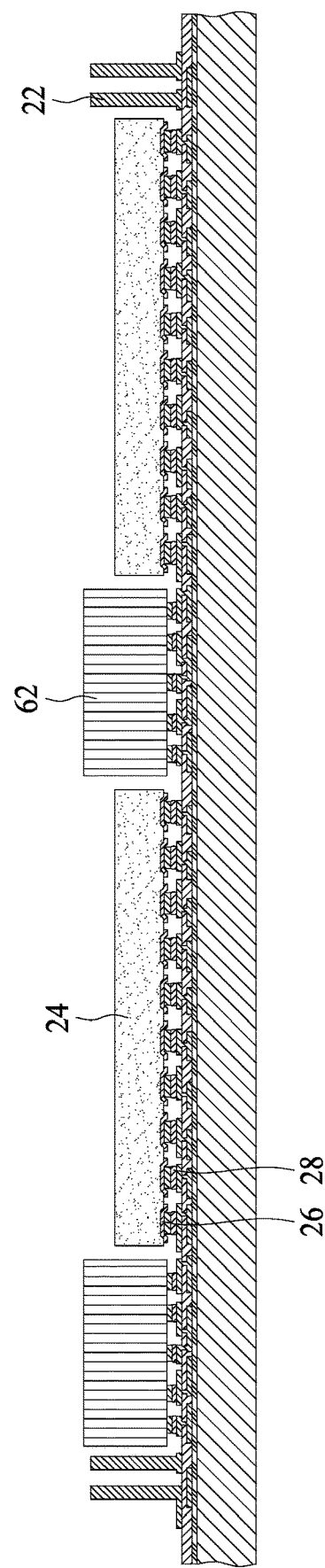
FIG. 41 illustrates one or more stages of a method of manufacturing a stacked semiconductor package assembly according to some embodiments of the present disclosure.

Referring to FIG. 41, one or more interposer modules 62 are disposed over the RDL structure 14. The interposer modules 62 may be electrically connected to the RDL structure 14 (e.g., the second RDL 18 of the RDL structure 14) by, e.g., flip-chip mounting. In some embodiments, conductive vias of the interposer modules 62 may include, e.g., Au, Ag, Ni, Cu, other metal(s) or alloy(s), or a combination of two or more thereof.

Furthermore, one or more electronic devices 24 are disposed over the RDL structure 14 and the dielectric layer 20, and are electrically connected to the RDL structure 14 by, e.g., flip-chip mounting. As illustrated in FIG. 41, each of the electronic devices 24 includes contact pads 26 for electrical connections. In some embodiments, the contact pads 26 may be C4 bumps, a BGA or an LGA.

Connectors 28 are disposed between the contact pads 26 of the electronic devices 24 and the RDL structure 14, and electrically connect the contact pads 26 of the electronic devices 24 to the RDL structure 14 (e.g., the second RDL 18 of the RDL structure 14). The connectors 28 can be, for example, conductive bumps formed from, or including, solder or another conductive material, and/or conductive posts formed from, or including, copper, a copper alloy, or another metal, another metal alloy, or another combination of metals or other conductive materials. As illustrated in FIG. 41, each of the electronic devices 24 may be an active device corresponding to a semiconductor die or chip, although it is contemplated that the electronic devices 24, in general, can be any active devices (semiconductor dies or chips, transistors, etc.), any passive devices (e.g., resistors, capacitors, inductors, transformers, etc.), or a combination of two or more thereof.

Referring to FIG. 42, a package body 30 is disposed or formed to encapsulate the electronic devices 24, the interposer modules 62 and the conducting posts 22. The structure of FIG. 31 is also referred to as overmold assembly. As illustrated in FIG. 42, the interposer modules 62 are embedded in the package body 30. In other words, top surfaces of the interposer modules 62 are covered by the package body 30. Similarly, the conductive posts 22 are embedded in the overmold assembly. In other words, top surfaces of the conductive posts 22 are covered by the package body 30. In some embodiments, the package body 30 may include, for example, one or more organic materials (e.g., molding compound, BT, PI, PBO, solder resist, ABF, PP, epoxy-based material, or a combination of two or more thereof), inorganic materials (e.g., silicon, glass, ceramic, quartz, or a combination of two or more thereof), liquid, dry-film material(s), or a combination of two or more thereof.

Referring to FIG. 43, a portion of the package body 30 is removed to expose the interposer modules 62 and the conductive posts 22. A portion of the package body 30 may be removed using, e.g., grinding, lapping, or another suitable material removal technique. As illustrated in FIG. 43, the package body 30 includes a surface 34. At least a portion of a terminal end of each conductive via of the interposer module 62 is exposed from the surface 34 of the package body 30. In some embodiments, the terminal end of the conductive via may be substantially co-planar with the surface 34 of the package body 30.

Similarly, at least a portion of a terminal end of each conductive post 22 is exposed from the surface 34 of the package body 30. In some embodiments, the terminal end of the conductive post 22 may be substantially co-planar with the surface 34 of the package body 30. Surfaces of the electronic devices 24 are lower than the surface 34 of the package body 30. In other words, the electronic devices 24 remain encapsulated by the package body 30.

Figure 44:
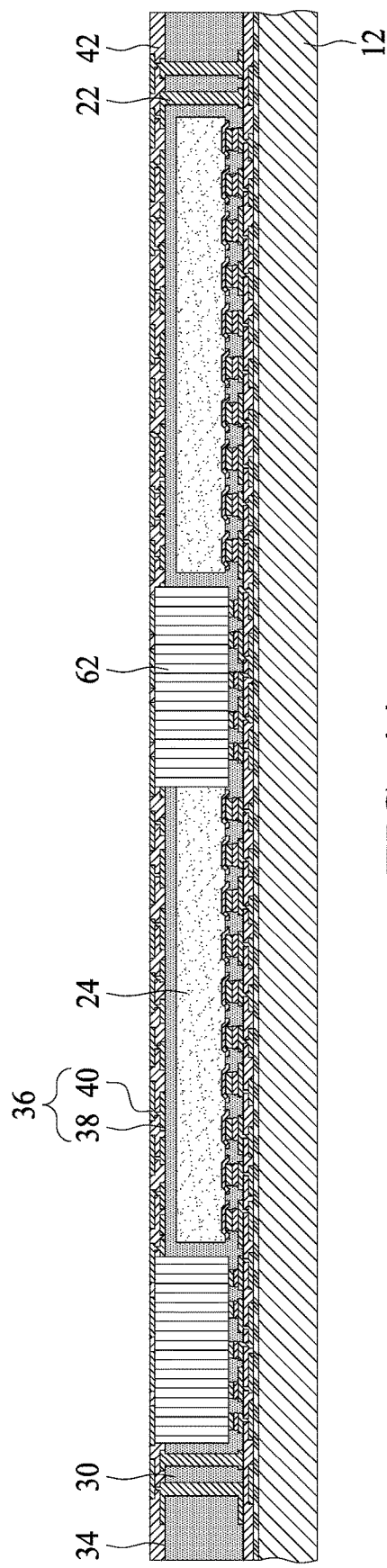
FIG. 44 illustrates one or more stages of a method of manufacturing a stacked semiconductor package assembly according to some embodiments of the present disclosure.

Referring to FIG. 44, another RDL structure 36 is disposed or formed on the surface 34 of the package body 30. In some embodiments, the RDL structure 36 may include one or more RDLs. For example, as illustrated in FIG. 44, the RDL structure 36 may include a first RDL 38 and a second RDL 40 disposed over the first RDL 38. In some embodiments, at least some traces of the first RDL 38 are electrically connected to some traces of the second RDL 40. In some embodiments, the RDL structure 36 includes, e.g., Au, Ag, Ni, Cu, other metal(s) or alloy(s), or a combination of two or more thereof.

The interposer modules 62 may be electrically connected to the RDL structure 36 (e.g., the first RDL 38 of the RDL structure 36). Similarly, the conductive posts 22 may be electrically connected to the RDL structure 36 (e.g., the first RDL 38 of the RDL structure 36). A dielectric layer 42 is disposed or formed to encapsulate at least a portion of the RDL structure 36. In some embodiments, the dielectric layer 42 may include organic material, solder mask, PI, epoxy, ABF, molding compound, or a combination of two or more thereof.

Figure 45:
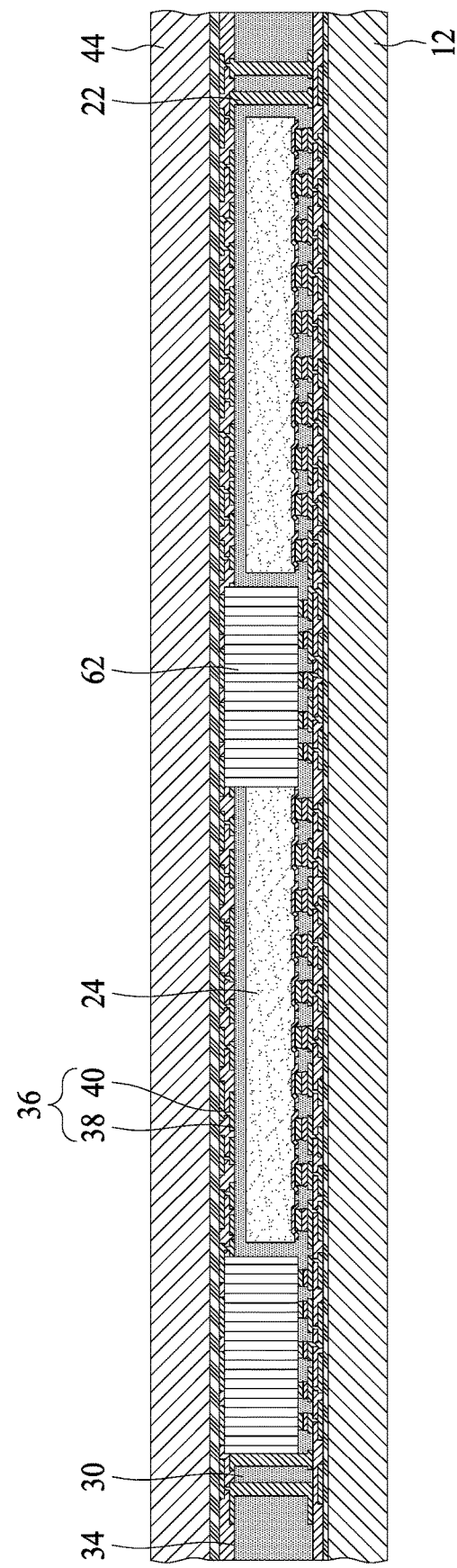
FIG. 45 illustrates one or more stages of a method of manufacturing a stacked semiconductor package assembly according to some embodiments of the present disclosure.

Referring to FIG. 45, a carrier 44 is disposed over the RDL structure 36. For example, the carrier 44 may be bonded to the RDL structure 36 and/or the dielectric layer 42. The carrier 44 can be any of a variety of suitable carriers, such as wafers or panels.

Referred to FIG. 46, the structure shown in FIG. 45 is flipped upside down. The carrier 12 is removed by, e.g., stripping. Thus, traces of the RDL structure 14 (e.g., the first RDL 16 of the RDL structure 14) are exposed.

Furthermore, one or more electronic devices 46 are disposed over the RDL structure 14 and/or the dielectric layer 20, and are electrically connected to the RDL structure 14 by, e.g., flip-chip mounting. As illustrated in FIG. 46, each of the electronic devices 46 includes contact pads 48 for electrical connections on an active surface (also referred to as active side) of each electronic device 46. In some embodiments, the contact pads 48 may be C4 bumps, a BGA or an LGA.

Connectors 50 are disposed between the contact pads 48 of the electronic devices 46 and the RDL structure 14, and electrically connect the contact pads 48 of the electronic devices 46 to the RDL structure 14 (e.g., the first RDL 16 of the RDL structure 14). The connectors 50 can be, for example, conductive bumps formed from, or including, solder or another conductive material, and/or conductive posts formed from, or including, copper, a copper alloy, or another metal, another metal alloy, or another combination of metals or other conductive materials. As illustrated in FIG. 46, each of the electronic devices 46 may be an active device corresponding to a semiconductor die or chip, although it is contemplated that the electronic devices 46, in general, can be any active devices (semiconductor dies or chips, transistors, etc.), any passive devices (e.g., resistors, capacitors, inductors, transformers, etc.), or a combination of two or more thereof.

Referred to FIG. 47, an underfill 52 may be disposed to cover the active surfaces of the electronic devices 46 and connectors 50. In some embodiments, the underfill 52 includes an epoxy resin, a molding compound (e.g., an epoxy molding compound or other molding compound), a polyimide, a phenolic compound or material, a material including a silicone dispersed therein, or a combination of two or more thereof. In some embodiments, the underfill 52 may be a CUF, a MUF or a dispensing gel, depending on specifications of different embodiments.

Figure 48:
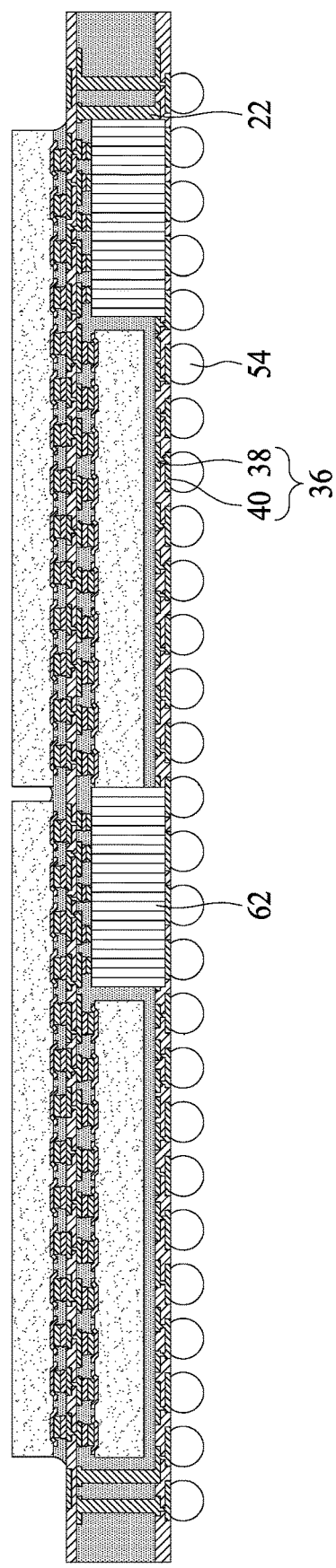
FIG. 48 illustrates one or more stages of a method of manufacturing a stacked semiconductor package assembly according to some embodiments of the present disclosure.

Referred to FIG. 48, the carrier 44 is removed by, e.g., stripping. Thus, traces of the RDL structure 36 (e.g., the second RDL 40 of the RDL structure 36) are exposed. Further, connecting elements 54 (e.g., bumps or solder balls) are disposed to electrically connect the RDL structure 36 (e.g., the second RDL 40 of the RDL structure 36) to form the stacked semiconductor assembly 1e that includes that conductive posts 22 and that interposer modules 62. In some embodiments, the connecting elements 54 are C4 bumps, BGA or LGA. In some embodiments, the connecting elements 54 can be formed by, e.g., electroplating, electroless plating, sputtering, paste printing, bumping or bonding process. In some embodiments, the connecting elements 54 are conductive pillars (e.g., copper pillars, other metal pillars, or metal-alloy pillars). For example, the stacked semiconductor package may be mounted to and be electrically connected to a circuit board or a substrate through the conductive pillars using, e.g., a flip chip process.

In some embodiments, distribution patterns of conductive vias of interposer modules (e.g., interposer module 62) may vary. Furthermore, the conductive vias of the interposer modules may have different via diameters. For example, an interposer module may include conductive vias having a smaller diameter for signal communications and conductive vias having a larger diameter for power and/or ground connections. In some embodiments, an interposer module can include a routing layer and/or one or more passive components.

Figure 49:
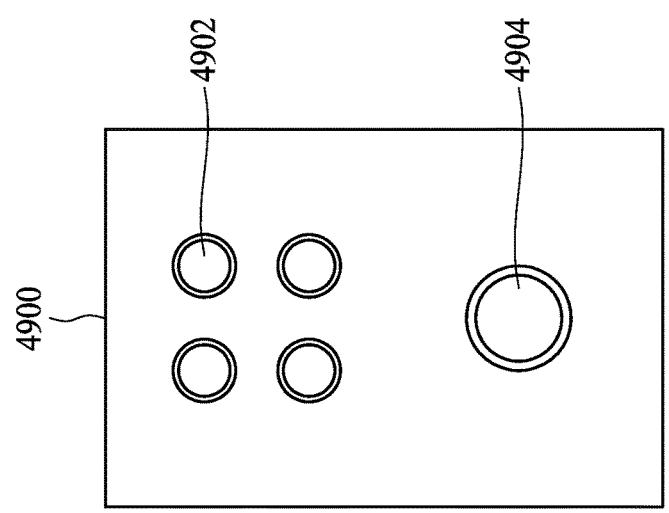
FIG. 49 illustrates a bottom view of an interposer module according to some embodiments of the present disclosure.

FIG. 49 illustrates a bottom view of an interposer module according to some embodiments of the present disclosure. The interposer module 4900 includes multiple conductive vias 4902 having a smaller diameter and at least one conductive via 4904 having a larger diameter. The conductive vias 4902 may be used for signal communications and the conductive via 4904 may be used for power and/or ground connections. In some other embodiments, the number of conductive via(s) 4902, the number of the conductive via(s) 4904, and the diameters of the conductive vias may be different from the embodiments illustrated in FIG. 49.

Figure 50:
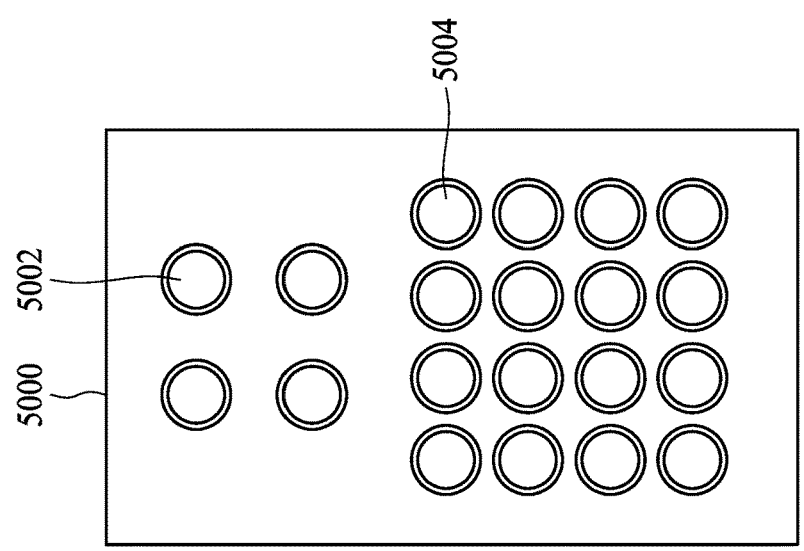
FIG. 50 illustrates a bottom view of an interposer module according to some embodiments of the present disclosure.

FIG. 50 illustrates a bottom view of an interposer module according to some embodiments of the present disclosure. The interposer module 5000 includes multiple conductive vias 5002 and multiple conductive vias 5004. The number (or density) of the conductive vias 5002 may be less than the number (or density) of the conductive vias 5004. The conductive vias 5002 may be used for signal communications and the conductive vias 5004 may be used for power and/or ground connections. For example, each of the conductive vias 5002 may be used as a signal communication channel, while multiple conductive vias 5004 together (also referred to as redundant conductive vias) may be used as a channel for power and/or ground connections. In some other embodiments, the number of conductive via(s) 5002, the number of the conductive via(s) 5004, and the densities of the conductive vias may be different from the embodiments illustrated in FIG. 50.

Figure 51:
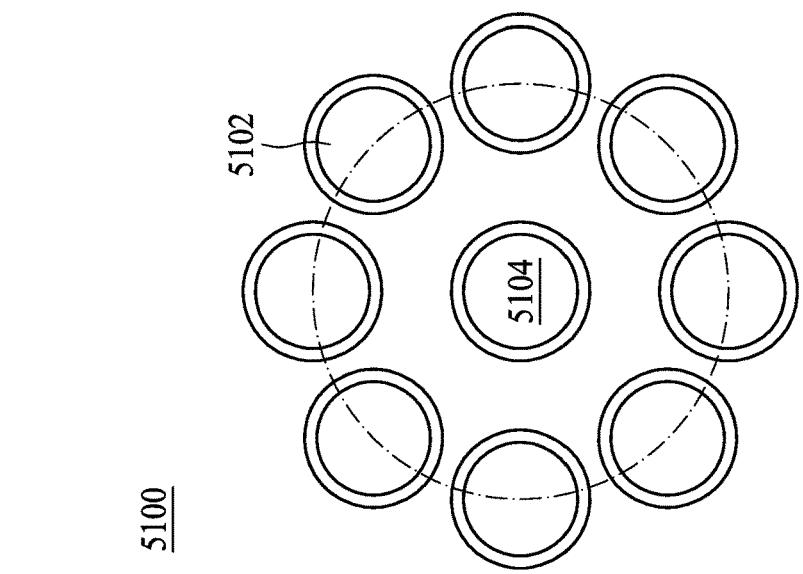
FIG. 51 illustrates a bottom view of an interposer module according to some embodiments of the present disclosure.

In some embodiments, a plurality of ground conductive vias may be disposed to surround a central conductive via to act as a shield for one or more central conductive vias. FIG. 51 illustrates a bottom view of an interposer module according to some embodiments of the present disclosure. The interposer module 5100 includes multiple conductive vias 5102 and one or more central conductive vias 5104 surrounded by the conductive vias 5102. The conductive vias (also referred to as ground conductive vias) are used for ground connections. The conductive vias 5104 (also referred to as signal conductive vias) are used for signal communication. The ground conductive vias 5102 surround the one or more signal conductive vias 5104 and form an electromagnetic shield for the signal conductive vias 5104, so that at least some of external electromagnetic interferences to the signal conductive vias 5104 are blocked by the ground conductive vias 5102. In some other embodiments, the number of conductive via(s) 5102 and the number of the conductive via(s) 5104 may be different from the embodiments illustrated in FIG. 51.

Figure 52:
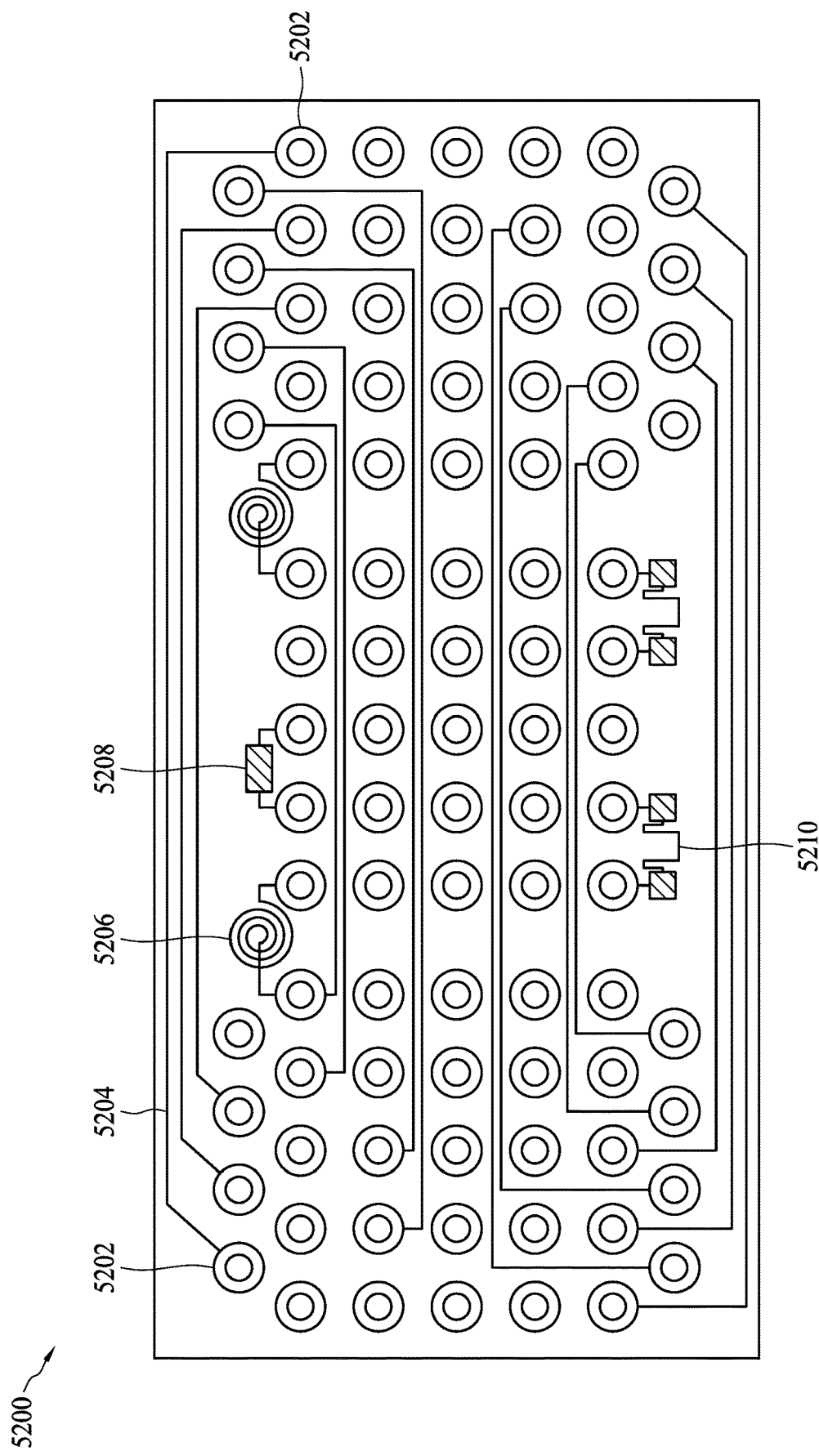
FIG. 52 illustrates an interposer module according to some embodiments of the present disclosure.

FIG. 52 illustrates a view of an interposer module according to some embodiments of the present disclosure. The interposer module 5200 includes multiple conductive vias 5202 and multiple traces 5204. The traces 5204 form a routing layer. In some embodiments, the routing layer is disposed on a top surface of the interposer module 5200, although it may also be disposed on a bottom surface of the interposer module 5200. The traces 5204 connect at least one conductive via 5202 to at least another conductive via 5202. In some embodiments, the traces 5204 electrically connect the conductive vias 5202 to one or more passive components, such as a resistor 5210, an inductor 5206, and a capacitor 5208.

As used herein, the singular terms "a," "an," and "the" may include plural referents unless the context clearly dictates otherwise. Thus, for example, reference to an electronic device may include multiple electronic devices unless the context clearly dictates otherwise.

As used herein, the terms "connect," "connected," and "connection" refer to an operational coupling or linking. Connected components can be directly or indirectly coupled to one another, for example, through another set of components.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Two surfaces can be deemed to be coplanar or substantially coplanar if a displacement between the two surfaces is no greater than 5 μm, no greater than 2 μm, no greater than 1 μm, or no greater than 0.5 μm.

Spatial descriptions, such as "above," "below," "up," "left," "right," "down," "top," "bottom," "vertical," "horizontal," "side," "higher," "lower," "upper," "under," and so forth, are indicated with respect to the orientation shown in the figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" or "about" the same as or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In the description of some embodiments, a component provided "on," "over," or "below" another component can encompass cases where the former component is directly adjoining (e.g., in physical contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package comprising:
   a bottom electronic device having an active surface and a back surface opposite to the active surface;
   an interposer module including a plurality of conductive vias and having a top surface and a bottom surface, wherein the conductive vias of the interposer module have different diameters, wherein the top surface of the interposer module is not leveled with the active surface of the bottom electronic device, and wherein the bottom surface of the interposer module is not leveled with the back surface of the bottom electronic device;
   a top electronic device having an active surface and disposed above the bottom electronic device and above the interposer module;
   a package body encapsulating the bottom electronic device and the interposer module and having a top surface and a bottom surface, wherein the top surface of the interposer module is leveled with the top surface of the package body, and wherein the bottom surface of the interposer module is leveled with the bottom surface of the package body; and
   a double sided redistribution layer (RDL) structure disposed between the bottom electronic device and the top electronic device, the active surface of the bottom electronic device facing toward the double sided RDL structure, the active surface of the top electronic device facing toward the double sided RDL structure, the double sided RDL structure electrically connecting the active surface of the bottom electronic device to the active surface of the top electronic device, the double sided RDL structure electrically connecting the active surface of the top electronic device to the interposer module, the double sided RDL comprising:
      a first RDL structure,
      a second RDL structure disposed under the first RDL structure and embedded under the top surface of the package body, and
      a single dielectric layer between the active surface of the bottom electronic device and the active surface of the top electronic device, the single dielectric layer comprising a top surface exposing the first RDL structure and a bottom surface in direct contact with the second RDL structure, the bottom surface of the single dielectric layer being further in contact with the interposer module allowing the top electronic device and the bottom electronic device to communicate with an external device and receive electrical power through the first RDL structure, the second RDL structure, and the plurality of conductive vias of the interposer module, wherein:

the semiconductor device package comprises a plurality of bottom electronic devices including the bottom electronic device, and two or more of the bottom electronic devices are configured to communicate with each other via the double sided RDL structure, or the semiconductor device package comprises a plurality of top electronic devices including the top electronic device, and two or more of the top electronic devices are configured to communicate with each other via the double sided RDL structure.

2. The semiconductor device package of claim 1, further comprising:
a third RDL structure disposed below the bottom electronic device and below the interposer module,
the interposer module electrically connecting the double sided RDL structure to the third RDL structure.

3. The semiconductor device package of claim 2, further comprising a conductive post electrically connecting the double sided RDL structure to the third RDL.

4. The semiconductor device package of claim 1, wherein the double sided RDL structure electrically connects the active surface of the bottom electronic device to the interposer module.

5. The semiconductor device package of claim 1, wherein the package body covers the back surface of the bottom electronic device.

6. The semiconductor device package of claim 1, wherein the interposer component includes a routing layer electrically connecting a first one of the conductive vias to a second one of the conductive vias.

7. The semiconductor device package of claim 1, wherein at least some traces of the first RDL structure are electrically connected to at least some traces of the second RDL structure.

8. The semiconductor device package of claim 2, wherein the third RDL structure comprises a top RDL and a bottom RDL, and at least some traces of the top RDL are electrically connected to at least some traces of the bottom RDL.

9. The semiconductor device package of claim 1, wherein the plurality of conductive vias includes a first conductive via having a smaller diameter for signal connection and a second conductive via having a larger diameter for power connection, ground connection, or combinations thereof.

10. The semiconductor device package of claim 1, wherein a circumference of each of the conductive vias of the interposer module is circular in shape from a top view perspective.

11. A semiconductor device package comprising:
a top electronic device having an active surface;
a bottom electronic device having an active surface facing toward the active surface of the top electronic device, and a back surface opposite to the active surface of the bottom electronic device;
an interposer module including a plurality of conductive vias and having a top surface and a bottom surface, wherein the conductive vias of the interposer module have different diameters, wherein the top surface of the interposer module is not leveled with the active surface of the bottom electronic device, and wherein the bottom surface of the interposer module is not leveled with the back surface of the bottom electronic device;
a package body encapsulating the interposer module and the bottom electronic device and covering the back surface of the bottom electronic device, where the package body has a top surface and a bottom surface, wherein the top surface of the interposer module is leveled with the top surface of the package body, and wherein the bottom surface of the interposer module is leveled with the bottom surface of the package body; and
a double sided redistribution layer (RDL) structure disposed between the bottom electronic device and the top electronic device, the double sided RDL structure electrically connecting the active surface of the bottom electronic device to the active surface of the top electronic device, and electrically connected to the interposer module the double sided RDL comprising:
a first RDL structure,
a second RDL structure disposed over the first RDL structure and embedded under the top surface of the package body, and
a single dielectric layer between the active surface of the bottom electronic device and the active surface of the top electronic device, the single dielectric layer comprising a top surface exposing the first RDL structure and a bottom surface in direct contact with the second RDL structure, the bottom surface of the single dielectric layer being further in contact with the interposer module allowing the top electronic device and the bottom electronic device to communicate with an external device and receive electrical power through the first RDL structure, the second RDL structure, and the plurality of conductive vias of the interposer module, wherein:

the semiconductor device package comprises a plurality of bottom electronic devices including the bottom electronic device, and two or more of the bottom electronic devices are configured to communicate with each other via the double sided RDL structure, or the semiconductor device package comprises a plurality of top electronic devices including the top electronic device, and two or more of the top electronic devices are configured to communicate with each other via the double sided RDL structure.

12. The semiconductor device package of claim 11, wherein the interposer module extends through the package body and includes a plurality of conductive vias electrically connected to the double sided RDL structure.

13. The semiconductor device package of claim 11, further comprising:
a conductive post extending through the package body and electrically connected to the double sided RDL structure.

14. The semiconductor device package of claim 11, further comprising:
a plurality of connectors disposed between the active surface of the bottom electronic device and the double sided RDL structure, the connectors including solder.

15. A semiconductor device package comprising:
a bottom electronic device having an active surface;
an interposer module including a plurality of conductive vias and having a top surface and a bottom surface, wherein the conductive vias of the interposer module have different diameters, wherein the top surface of the interposer module is not leveled with the active surface of the bottom electronic device, and wherein the bottom surface of the interposer module is not leveled with the back surface of the bottom electronic device;

a top electronic device having an active surface and disposed above the bottom electronic device and above the interposer module;

a package body encapsulating the bottom electronic device and the interposer module and having a top surface and a bottom surface, wherein the top surface of the interposer module is leveled with the top surface of the package body, and wherein the bottom surface of the interposer module is leveled with the bottom surface of the package body;

a double sided redistribution layer (RDL) structure disposed between the bottom electronic device and the top electronic device, the active surface of the bottom electronic device facing toward the double sided RDL structure, the active surface of the top electronic device facing toward the double sided RDL structure, the double sided RDL structure electrically connecting the active surface of the bottom electronic device to the active surface of the top electronic device, the double sided RDL structure electrically connecting the active surface of the top electronic device to the interposer module, the double sided RDL comprising:

a first RDL structure, a second RDL structure disposed over the first RDL structure and embedded under the top surface of the package body, and a single dielectric layer between the active surface of the bottom electronic device and the active surface of the top electronic device, the single dielectric layer comprising a top surface exposing the first RDL structure and a bottom surface in direct contact with the second RDL structure, the bottom surface of the single dielectric layer being further in contact with the interposer module allowing the top electronic device and the bottom electronic device to communicate with an external device and receive electrical power through the first RDL structure, the second RDL structure, and the plurality of conductive vias of the interposer module; and a conductive post electrically connecting the double sided RDL structure, wherein a density of the conductive vias of the interposer module is higher than the conductive post.

16. The semiconductor device package of claim 15, further comprising a plurality of interposer modules including the interposer module.

17. The semiconductor device package of claim 15, wherein the plurality of conductive vias comprise a plurality of ground conductive vias and a plurality of signal conductive vias.

18. The semiconductor device package of claim 15, further comprising a plurality of traces that connect at least a first of the conductive vias to at least a second of the conductive vias.

19. The semiconductor device package of claim 18, wherein the traces electrically connect the conductive vias to one or more passive components.

20. The semiconductor device package of claim 15, wherein a top terminal end of the conductive post is leveled with the top surface of the interposer module, and wherein a bottom terminal end of the conductive post is leveled with the bottom surface of the interposer module.

* * * * *